(12) United States Patent
Jagt et al.

(10) Patent No.: US 10,871,268 B2
(45) Date of Patent: Dec. 22, 2020

(54) LED LIGHTING UNIT

(71) Applicant: KONINKLIJKE PHILIPS N.V., Eindhoven (NL)

(72) Inventors: Hendrik Johannes Boudewijn Jagt, Eersel (NL); Floris Maria Hermansz Crompvoets, Bunde (NL); Wouter Dekkers, Roosendaal (NL); Fritz Helmut Zahn, Geldrop (DE); Olexandr Valentynovych Vdovin, Maarheeze (UA); Jacobus Johannes Franciscus Gerardus Heuts, Roermond (NL); Maria Johanna Helena Jochem, Valkenswaard (NL); Christian Kleijnen, Ittervoort (NL)

(73) Assignee: KONINKLIJKE PHILIPS N.V.

( * ) Notice: Subject to any disclaimer, the term of this patent is extended or adjusted under 35 U.S.C. 154(b) by 0 days.

(21) Appl. No.: 15/318,068

(22) PCT Filed: Jun. 26, 2015

(86) PCT No.: PCT/EP2015/064559
§ 371 (c)(1),
(2) Date: Dec. 12, 2016

(87) PCT Pub. No.: WO2015/197832
PCT Pub. Date: Dec. 30, 2015

(65) Prior Publication Data
US 2017/0126944 A1 May 4, 2017

(30) Foreign Application Priority Data
Jun. 26, 2014 (EP) ..................................... 14174021

(51) Int. Cl.
*F21V 5/00* (2018.01)
*G03B 15/05* (2006.01)
(Continued)

(52) U.S. Cl.
CPC ................ *F21V 5/002* (2013.01); *F21K 9/64* (2016.08); *F21V 17/101* (2013.01);
(Continued)

(58) Field of Classification Search
CPC ................ H04N 5/2256; H04N 5/2253; F21V 33/0052; F21V 5/002; F21V 17/101;
(Continued)

(56) References Cited

U.S. PATENT DOCUMENTS 3,881,678 A * 5/1975 Quinn ..................... G03B 15/05
248/230.8
6,352,359 B1 * 3/2002 Shie ..................... F21S 48/1233
362/331
(Continued)

FOREIGN PATENT DOCUMENTS

CN 102162622 A 8/2011
CN 102326102 A 1/2012
(Continued)

OTHER PUBLICATIONS

European Office Action dated Apr. 20, 2017, Application No. 15731941.9.
(Continued)

*Primary Examiner* — Isiaka O Akanbi
*Assistant Examiner* — Fatima N Farokhrooz

(57) ABSTRACT

An LED lighting unit comprising a support structure (14), an LED-based light emitting structure (10) mounted within the support structure and an optical beam shaping arrangement (50, 52) over the top of the support structure. The optical beam shaping arrangement comprises an optically transparent and thermally stable material, and the support structure supports the microstructured layer at a small height above the LED-based light emitting structure. This height may for example be less than 0.5 mm. The optical beam shaping
(Continued)

arrangement enables a compact and low height lighting unit to be mounted on a carrier by reflow soldering without damaging the optical beam-shaping component.

20 Claims, 12 Drawing Sheets

(51) Int. Cl.
    *F21K 9/64* (2016.01)
    *F21V 17/10* (2006.01)
    *F21V 33/00* (2006.01)
    *G02B 19/00* (2006.01)
    *H01L 33/50* (2010.01)
    *H04N 5/225* (2006.01)
    *F21Y 115/10* (2016.01)

(52) U.S. Cl.
    CPC ...... *F21V 33/0052* (2013.01); *G02B 19/0061* (2013.01); *G03B 15/05* (2013.01); *H01L 33/502* (2013.01); *H01L 33/505* (2013.01); *H04N 5/2253* (2013.01); *H04N 5/2256* (2013.01); *F21Y 2115/10* (2016.08); *G03B 2215/0567* (2013.01); *G03B 2215/0592* (2013.01)

(58) Field of Classification Search
    CPC ....... F21V 5/045; F21K 9/64; G02B 19/0061; H01L 33/502; H01L 33/505; F21Y 2115/10
    See application file for complete search history.

(56) References Cited

U.S. PATENT DOCUMENTS

| | | | |
|---|---|---|---|
| 6,503,564 B1* | 1/2003 | Fleming | B05D 1/60 427/255.6 |
| 8,434,883 B2 | 5/2013 | Doan et al. | |
| 9,038,536 B2 | 5/2015 | Verschuuren | |
| 9,618,839 B2 | 4/2017 | Ibn-Elhaj et al. | |
| 2004/0218390 A1* | 11/2004 | Holman | G02B 5/045 362/245 |
| 2007/0040097 A1* | 2/2007 | Mok | G02B 27/0944 250/208.1 |
| 2008/0043326 A1 | 2/2008 | Poulsen | |
| 2008/0043466 A1* | 2/2008 | Chakmakjian | F21V 5/007 362/237 |
| 2009/0103293 A1* | 4/2009 | Harbers | F21V 9/40 362/231 |
| 2010/0027240 A1* | 2/2010 | Chang | F21V 5/00 362/97.1 |
| 2010/0079059 A1 | 4/2010 | Roberts et al. | |
| 2010/0140655 A1* | 6/2010 | Shi | H01L 33/507 257/99 |
| 2010/0165634 A1* | 7/2010 | Hong | G02B 5/045 362/307 |
| 2010/0178046 A1 | 7/2010 | Moon et al. | |
| 2011/0134648 A1* | 6/2011 | Lin | F21V 5/007 362/311.06 |
| 2012/0026720 A1* | 2/2012 | Cho | G02B 5/0242 362/84 |
| 2012/0027998 A1* | 2/2012 | Ibn-Elhaj | G02B 5/1857 428/161 |
| 2012/0039078 A1* | 2/2012 | Masuda | G02F 1/133606 362/311.03 |
| 2012/0092852 A1* | 4/2012 | Doan | F21V 3/049 362/84 |
| 2012/0140489 A1 | 6/2012 | Chung et al. | |
| 2012/0300452 A1* | 11/2012 | Harbers | F21V 7/30 362/231 |
| 2012/0300491 A1* | 11/2012 | Hussell | H01L 24/49 362/602 |
| 2014/0003044 A1* | 1/2014 | Harbers | F21K 9/00 362/230 |
| 2014/0307444 A1* | 10/2014 | Gorlinskiy | F21V 5/002 362/294 |
| 2015/0029717 A1* | 1/2015 | Shen | F21V 5/005 362/235 |

FOREIGN PATENT DOCUMENTS

| | | |
|---|---|---|
| CN | 103185243 A | 7/2013 |
| EP | 2461089 A1 | 6/2012 |
| EP | 2599835 A1 | 6/2013 |
| JP | 2005274933 A | 10/2005 |
| WO | 2012060777 A2 | 5/2012 |
| WO | 2013009221 A2 | 1/2013 |
| WO | 2013018041 A1 | 2/2013 |

OTHER PUBLICATIONS

EPO as ISA, "International Search Report and Written Opinion" dated Sep. 25, 2015 from International Application No. PCT/EP2015/064559, filed Jun. 26, 2015, 10 pages.
Extended European Search Report dated Sep. 26, 2014, European Patent Application No. 14174021.7, 8 pages.
JP Office Action dated Jul. 9, 2019, Japanese Patent Application No. 2016-575087, 4 pages.
Second Office Action dated May 22, 2019, Chinese Patent Application No. 201580034607.4, 11 pages.
First Office Action dated Oct. 23, 2018, China Application No. 201580034607.4, 17 pages.

* cited by examiner (a)

(b)

(a)

(b)

LED LIGHTING UNIT

CROSS-REFERENCE TO RELATED APPLICATIONS

The present application is a § 371 application of International Application No. PCT/EP2015/064559 filed on Jun. 26, 2015 and entitled "LED LIGHTING UNIT," which claims the benefit of European Patent Application No. 14174021.7, filed Jun. 26, 2014. International Application No. PCT/EP2015/064559 and European Patent Application No. 14174021.7 are incorporated herein.

FIELD OF THE INVENTION

This invention relates to LED lighting units, for example for use in camera or video flash applications, such as flash units for mobile phones or other portable mobile device such as tablets and laptop computers.

BACKGROUND OF THE INVENTION

There is a trend to miniaturize LED lighting units. A compact LED lighting unit can for example be considered to be a lighting unit with a package height less than 3 mm, and an output aperture with an area of less than 100 mm$^2$. A compact lighting unit of this type can be integrated into a portable device such as a mobile phone.

Compact LED lighting units such as flash LED packages typically consist of high power LEDs to generate white light, usually at a colour temperature of about 5000-6500 K, combined with Fresnel optical lenses either through integration with the LED package directly or with a separate housing for the lens and the LED package.

These packages typically use a high power blue LED covered with a phosphor layer which converts a part of the radiation into the green-red spectral range to result in a white color point. The blue LED has typically a 1 mm$^2$ size and is mounted on a ceramic support substrate. The total outer dimensions of the LED substrate are for example typically 1.6×2.0 mm. Some packages appear very yellow due to the phosphor layer; other packages are made to appear much whiter by molding white scattering material on top and around the LED phosphor. Customers tend to dislike the yellow appearance when magnified by a Fresnel lens and hence an off-state-white (OSW) appearing package is sometimes preferred even though the efficacy is reduced by the extra white scattering layers.

Flash LEDs of this type are for example applied as flash units in mobile phone applications. To concentrate the light on a 4:3 or 16:9 scene that is captured by the camera, the light of the flash LED, which initially has Lambertian angular distribution of intensity, is collimated by the Fresnel lens. This can be achieved by clamping the LED package and a separate Fresnel lens into a package assembly, for example with a typical height of about 3 mm. As mentioned above, the Fresnel lens can instead be combined with the LED package onto a thin PCB as one integrated, more compact unit.

FIG. 1 shows a LED lighting unit 1 with a Fresnel lens optical structure on the top surface. The lens is molded around the LED package on a thin PCB and this can for example achieve a reduced build height of 2.2 mm.

One example of Fresnel lens comprises optical elements in the form of facets that refract light in the center of the lens, and reflect light upwards at the periphery of the lens in order to collimate the light emitted by the LED. All-refracting lenses are also possible.

The Fresnel lens needs to be located at a certain minimum distance from the LED in order to operate properly as a lens and a careful alignment of the position of the LED to the optical center of the Fresnel lens is needed.

The build height of the flash LED with Fresnel lens is very important to mobile phone makers because it is a discriminating trend to make mobile phones thinner and thinner and use less and less space for the components inside the phone, especially in the depth direction. Breakthroughs in build height of the components in the phone are therefore very important.

In addition to physical dimension limitations, there are specific requirements to the beam profile that is emitted by a flash LED package. These requirements relate to the illumination of a scene captured by the camera and can for example be measured by projecting the light on a screen.

The flash unit using a known Fresnel lens design has several limitations. There is a fundamental distance required between the Fresnel lens and the LED source as indicated above. To make the package thinner, the lateral dimensions of the lens and LED package need to be scaled down. This means a smaller LED, which gives limitations to the amount of light that can be generated. For instance, for a typical LED die of 1×1 mm$^2$ the build height with a Fresnel lens is limited to about 2 mm.

A problem with such small build heights is that the optical component (either Fresnel lens or other collimating optics) is very close to the location where the unit is mounted on an underlying circuit board. If reflow soldering is used to mount the LED unit on a circuit board, the optical components are exposed to high temperatures, which may not be easily tolerated by the optical component design.

SUMMARY OF THE INVENTION

The invention is defined by the claims.

According to the invention, there is provided a LED lighting unit comprising:

a support structure;

an LED-based light emitting structure mounted within the support structure; and an optical beam shaping arrangement over the top of the support structure, wherein the optical beam shaping arrangement comprises a microstructured layer which comprise an optically transparent and thermally stable material, and wherein the support structure supports the microstructured layer of the beam shaping arrangement at a height of less than the square root of a light emitting area of the LED-based light emitting structure above the LED-based light emitting structure, and wherein the microstructured layer comprises at least one array of micro-elements each having one or more sides which meet at a top apex wherein the side or sides are straight from their base to the top apex.

This design is preferably able to withstand the short duration high temperatures encountered during reflow soldering, so that even with a small unit height, it can be soldered to an underlying printed circuit board, for example. During this reflow soldering, the microstructured layer should remain dimensionally stable (no size loss) with no wrinkling or bulging, and additionally no yellowing. This may not be possible for some conventional materials such as an acrylic resin-on polycarbonate base layer.

The term "microstructured" is used to denote small shaped elements with individual structure dimensions of mm scale or smaller.

The beam shaping arrangement may function as a micro-collimating structure that transmits and collimates part of the incident light. The ridge design enables the height to be reduced while preserving the optical collimation function. The ridges function as light recycling elements.

The design enables the use of a larger output area of the LED emitter (for a given overall lateral dimension) which is thus able to produce more light. Alternatively the for a given size of optical output, the overall device can be made smaller in lateral dimensions while achieving the same optical output.

The micro-elements may be ridges (or valleys) which extend in a line giving a one dimensional repetition, or they may be pyramids forming a two dimensional repetition. They may also be cones (thus having only a single side) extending from a base to a top apex. In all cases, the side or sides extend straight from the base to the apex, with no curved lensing surface. Thus, in cross section through a plane perpendicular to the layer which passes through the apexes, the sides are straight. The lines along which the microstructures extend (i.e. in the plane of the layer) may however be straight or curved.

The height limitation is the height above the surface of the LED-based light emitting structure. In the case of a direct emitting LED, this surface is the surface of the LED die. If a white phosphor-converted LED is used, the height limitation is the height above the upper surface of the phosphor. For a pre-patterned sapphire substrate LED, the height is considered above the epitaxial layer. The height is taken to the bottom of the microstructured layer of the beam shaping arrangement.

The term LED is intended to refer generally to solid state emitters, namely light emitting diodes including inorganic LEDs, organic LEDs or laser diodes.

By way of example, if the light emitting area is 1 $mm^2$, the height of the microstructured layer is then less than 1 mm over the LED-based light emitting structure.

In general, the height may be less than 0.5 mm to enable an extremely compact device.

The support structure may comprise reflective side walls extending between the LED-based light emitting structure and the optical beam shaping arrangement. The lighting unit then functions to recycle part of the LED light which has not been transmitted through the optical beam shaping arrangement in order to obtain the desired beam profile.

The microstructured layer may comprise a silicone or a hybrid silicone or a silicate (in particular a T-branched or Q-branched material rather than an ionic structure) or hybrid silicate or a sol-gel material. The term 'T branched' in this application means that there is at least one Silicon atom attached to three (poly)siloxane chains. Preferably this Silicon atom is chemical bound to oxygen of each of the (poly)siloxane chains. The term 'Q branched' in this application means that there is at least one Silicon atom attached to four (poly)siloxane chains. Preferably this Silicon atom is chemical bound to oxygen of each of the (poly)siloxane chains. These T-branched and Q-branched structures are themselves known, for example as disclosed in EP2599835.

The T-branched silicate may be referred to as a silsesquioxane. This enables manufacture using a low cost process and it enables high thermal and optical stability. Other materials may instead be used such as glass (for example by injection moulding) or patterned sapphire plates.

The optical beam shaping arrangement may optionally comprise a base layer and the microstructured layer over the base layer. The base layer provides structural rigidity if the microstructured layer alone does not have the required rigidity.

An adhesion promoting layer may be provided between the base layer and the microstructured layer. The adhesion promoting layer may comprise a silane, titanate or zirconate containing material. These materials may be in pure form or mixed into another stable material such as a silicone.

The microstructured layer may be in contact with a first material of first refractive index or bonded to a first material of first refractive index through an intermediate bonding layer, wherein the material of the microstructured layer has a refractive index of between 0.3 and 0.65 greater than the first refractive index. This provides the refractive index difference necessary for the beam shaping arrangement to operate in refractive or reflective mode in order to provide beam shaping properties. The microstructured layer may instead be bonded to the LED-based light emitting structure using a partial bonding layer having bonding portions and portions of a first material of first refractive index, The first material may comprise air with a refractive index of 1.0, or a low refractive index layer with refractive index below 1.3, or a glue or planarizing layer with a refractive index between 1.3 and 1.6. A glue may be used to bond multiple base layer and microstructured layer pairs together and a planarizing layer may be used to protect the structure.

In another arrangement, the microstructured layer is bonded to the LED-based light emitting arrangement.

This bonding may be to a phosphor layer of the LED-based light emitting arrangement. This enables the smallest height package to be achieved. An LED itself is typically hard and non-stick, but the phosphor layer can act itself as the bonding layer. Hence, a thinnest package is possible when no separate bonding layer is present. This direct contact will limit the beam shaping function but will help to extract more light. When the refractive index of the microstructured layer is higher than of the bonding material, the beam shaping function will become stronger by increasing this refractive index difference.

The LED-based light emitting structure may comprise:
an LED and a phosphor directly over the LED; or
an LED and a phosphor filling the support structure; or
an LED and a phosphor a layer beneath the first microstructured layer and spaced from the LED.

In some of these examples, the phosphor layer may thus be larger in area than the light output area of the LED, thereby providing a more uniform illumination to the optical layer or layers above.

The unit may comprise a plurality of beam shaping arrangements in a stack, and comprising air gaps between the beam shaping arrangements or adhesive between the beam shaping arrangements.

The unit may comprise a camera flash unit, and the invention also provides a mobile portable device comprising a camera optical sensor and a flash unit of the invention.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an LED-based lighting unit which comprises a support structure, an LED-based light emitting structure and an optical beam shaping arrangement over the top of the support structure. The optical beam shaping arrangement comprises a thermally stable microstructured layer, and the (underside of the) beam shaping arrangement is at a small height above the LED-based light emitting structure. The height is less than the square root of a light emitting area of the LED-based light emitting structure (10). For example, for a light emitting area of 1 mm$^2$, the height is less than 1 mm, for example less than 0.5 mm.

The optical beam shaping arrangement is designed to enable the lighting unit to be mounted on a carrier by reflow soldering without damaging the optics.

The optical beam shaping arrangement used in the system of the invention performs a beam shaping function. This function may for example approximate at least a partial collimation function, in the sense that the light exits with a controlled range of exit angles, to illuminate a desired field of view. In the examples below, the optical function will be referred to below as "collimation" for ease of explanation, but it will be understood that this should not be considered limiting. For example various beam shaping functions can be achieved with different types of foil structures such as symmetric or asymmetric prismatic grooves, prismatic/conical/pyramid structures facing the source or facing away from the source. These beam shaping functions may for example comprise beam re-direction, or batwing illumination patterns.

This invention will be described with reference to some LED unit designs as proposed by the applicant, simply by way of example. The invention relates specifically to the design of an optical layer which performs a beam processing function. The examples provided include two such optical layers, but the invention can equally be applied to structures which require only one optical layer.

Figure 1:
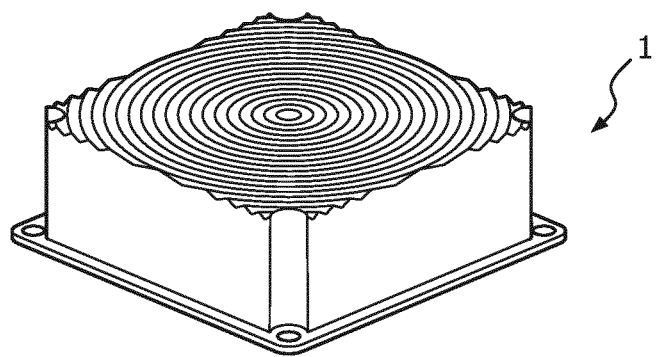
FIG. 1 shows a known LED flash with an integrated Fresnel lens on the upper surface of the package.
Figure 2:
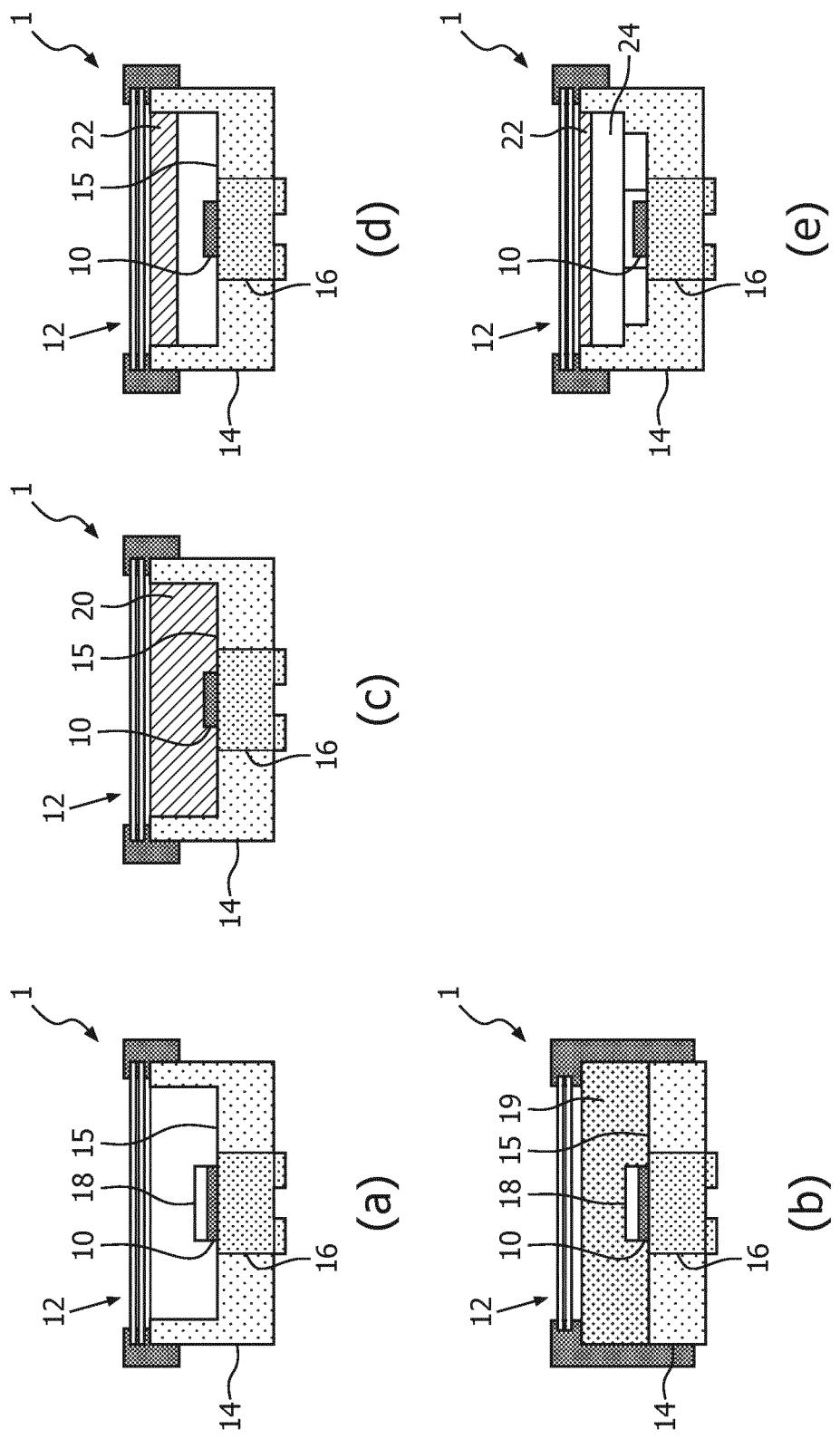
FIG. 2 shows various examples of LED flash making use of a high power die-on-ceramic ("DoC") LED packages.

FIG. 2 shows various examples, making use of a high power die-on-ceramic ("DoC") LED package 10 with a 'click-on' cap which incorporates a dual layer optical layer which functions as an optical beam shaping arrangement 12. This dual layer structure functions provides a beam shaping function, such as a collimation function. Each layer includes a structured layer in the form of a regular array of elongate parallel ridges facing away from the light source. The LED 10 is mounted at the base of a housing 14 which forms a reflective mix box construction.

The housing functions primarily as a support structure for mounting of the optical beam shaping components over the LED 10, but it optionally also helps to direct the light emitted by the LED towards the beam shaping component. For this purpose, the housing may have side walls which provide the support and a base. The base can then be for supporting the LED. However, the LED die may itself define the base so that the housing then comprises only a side wall arrangement. This side wall is reflective for efficient delivery of the LED light.

The LED is for example a blue InGaN based diode that is die attached to a ceramic submount 16. The LED can be a flip-chip die with electrical contacts at the back side. There are electrical vias in the ceramic submount 16 which is typically of AlN or $Al_2O_3$, such that the electrical contacts are also present at the backside of the ceramic submount 16 to make the whole assembly solderable at the back side using solder pads.

This soldering exposes the structure to high temperatures. For example a reflow temperature treatment can result in deformation or shrinking of many materials, such as polycarbonate and PET.

The package size can be made to be less than 1.5 mm, for example less than 1.3 mm, and a typical width in the range 3 to 5 mm.

FIG. 2 shows five examples which differ in the way a phosphor layer is implemented. The function of the phosphor layer is to convert a part of the blue radiation from the LED source into a green/yellow spectral range, which in combination with a blue LED emitter creates a white light output.

FIG. 2(a) shows a proximity phosphor 18. This is a conventional phosphor technology that is used in Fresnel lens based flash packages. The phosphor directly covers the blue LED chip. This means that all light emitting areas (chip output and phosphor) have a minimal size. This makes the emitter a small quasi-point source with which an enlarged optical beam shaping structure is aligned to collimate the emitted light for flash operation.

FIG. 2(b) shows the same structure but with an overmold 19 in the housing instead of air, and it shows that the housing is not necessarily a one-piece structure.

FIG. 2(c) shows the use of a phosphor 20 (sometimes known as a goop) which fills the housing. It is dispensed as a viscous liquid and cured to a solid state. The phosphor still covers the LED chip, but extends laterally and is typically applied in a thicker layer. The source area is enhanced because even though the blue LED emitter is small, the emission of the phosphor layer covers a larger area. This can be a more efficient phosphor system than the regular proximity phosphor that covers only the LED die and/or the package onto which the LED die is placed.

FIG. 2(d) shows a vicinity phosphor 22. This is in principle the most efficient phosphor configuration, but uncommon in such packages. The phosphor is not directly placed over the blue LED but located at a short distance, typically in the exit window of the package. In such a configuration, a good cooling path for the phosphor layer is desired which can be influenced by the selection of materials that are between the phosphor layer and the LED base. FIG. 2(e) shows the addition of a glass or translucent alumina (PolyCrystallineAlumina, PCA) layer 24.

In each of FIGS. 2(a) to 2(e), the overall device is a LED lighting unit 1. The housing 14 function as reflective housing, which has a reflective base 15 and an open top (reference 51 in FIG. 5).

The two structured layers have ridged microstructures facing upward. The ridges are parallel and thus form prismatic ridge/groove structures. Other possible optical structures are pyramids, cones, spherical lenses or cylindrical lenses, for example.

The layers have a thickness typically in the range of 30 to 150 microns (including the base substrate and ridge height). Each ridge has a typical width in the range 10 to 50 microns.

The LED package is preferably highly reflective (for instance >95%) as the microstructured layers reflect back a significant part of the incident light to be recycled.

A low refractive index layer is provided between the LED package and the beam shaping structure, and also between the individual microstructured layers if multiple layers are used. Typically the low index layer is an air interface. This refractive index of the intermediate layer(s) between the components is low in relation to the refractive indices of the LED package and the refractive index of the microstructured layers. A refractive index of 1 is for an air layer, the LED package may have a refractive index of 2.4 for a GaN LED die, a phosphor silicone can have a refractive index of 1.4-1.53.

When air interfaces are used against the structured surfaces of the microstructured layers, a refractive index for the structured layer of the microstructured layers can for example be 1.41 which is for a methylsiloxane sheet.

Figure 3:
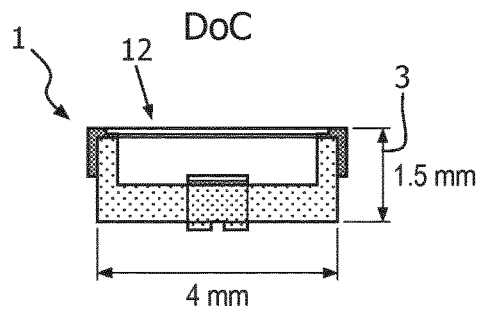
FIG. 3 shows some further examples of LED flash using die-on-ceramic packages and other smaller packages using so-called PSS-based (pre-patterned sapphire substrate) technology packages.
Figure 3:
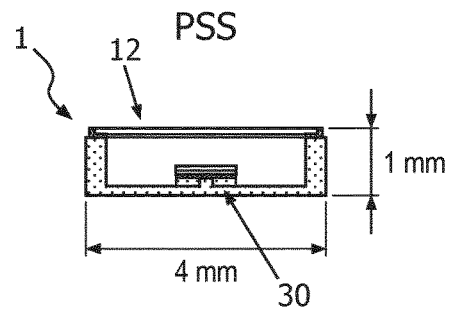
Figure 3:
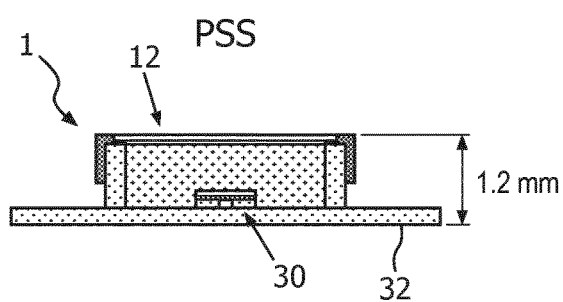
Figure 3:
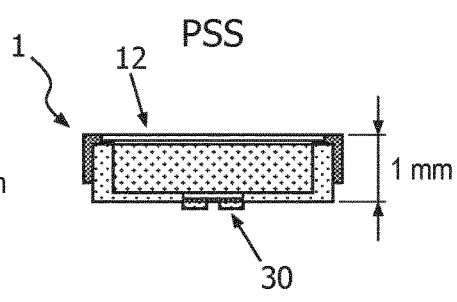
Figure 3:
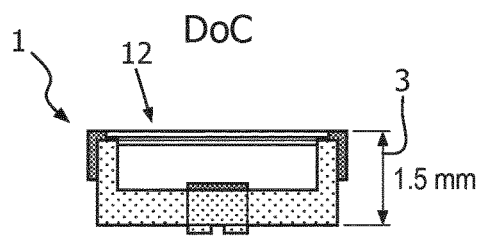
Figure 3:
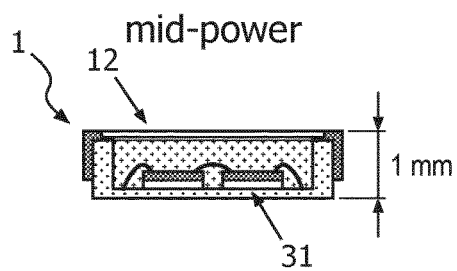

FIG. 3 shows further examples in which two different high power LEDs are compared to mid-power LEDs. Again, each device comprises a LED lighting unit 1. Each device has a height 3, and examples of possible height values are shown in FIG. 3. The die-on-ceramic (DoC) packages of FIG. 2 are compared with so-called PSS (pre-structured sapphire) chip scale package LEDs 30 as well with mid-power LEDs 31 with wire-bond connections.

The LED with chip scale package PSS technology does not have a ceramic submount but maintains a sapphire growth substrate on top onto which the InGaN LED layer is deposited. The backside is plated with electric connections to make the component backside solderable. The PSS package 30 can be much thinner, about 0.2-0.3 mm high compared to the DoC package which typically uses a 0.6 mm ceramic submount.

For a thin flash, the PSS structure 30 allows for a thinner flash height.

The mid-power LEDs are typically LEDs where the emitter is also positioned on the growth substrate, such as sapphire, and mounted with the sapphire substrate downwards, usually glued down into the package with a die attach adhesive material. The electrical connections are realized with wire bonds that connect the electrical contacts within the package to the top of the LED die. Multiple LEDs may be used in the package to realize the required amount of light output.

The various mid-power LEDs are connected in strings, which may be in either in series or in parallel connection. These mid-power LED chips are typically also very thin, typically in the order of 0.2-0.3 mm high, allowing a thin overall flash package.

FIG. 3 combines the various LED types with various phosphor types. The phosphor layer may be deposited directly on the LED chip, which is called a proximity phosphor. Such a phosphor layer may cover only the top of the chip, or the top of the package including the ceramic submount, or be wrapped around the emitter, also covering the sides of the transparent sapphire substrate. Furthermore, the phosphor may fill the package into which the LED is placed. This is often called a goop phosphor, in which the phosphor typically consists of inorganic phosphor particles embedded in a silicone resin that is dispensed within the package, such as a white molded leadframe package. Such a configuration is typically more efficient than a phosphor that only covers the emitter die. Furthermore, the phosphor may not cover the LED emitter at all, but be separated with a small distance, typically separated by a layer of transparent material, for instance silicone or glass or ceramic. The phosphor layer is then positioned in the vicinity of the top of the package, covering the package laterally to prevent blue light leakage from the package. Such a vicinity phosphor is typically more efficient that the other above mentioned phosphor types, provided that the LED package is highly reflective.

FIG. 3(a) shows a DoC structure using a proximity phosphor as in FIG. 3(a).

FIG. 3(b) shows a PSS structure 30 using a proximity phosphor and shows that the package height is reduced to 1 mm. The PSS LED is soldered into a cavity housing, such as a white silicone molded leadframe package. The proximity phosphor may be conformally deposited around the PSS chip. The cavity housing typically has backside contacts to allow further assembly of the flash LED to a PCB. The thin housing, thin PSS, and thin beam shaping arrangement result in an overall thin package in a height range of about 0.6 to 1.2 mm. The microstructured layers of the beam shaping arrangement 12 may be attached to the top of the housing, for instance with an adhesive glue or with an adhesive tape.

FIG. 3(c) shows a PSS LED package 30 using a phosphor which fills the housing again with a 1.2 mm package height over a thin reflective PCB 32 on which the LED chip and housing side walls are mounted. The housing may be a molded white silicone frame that is molded onto the PCB or attached with an adhesive. The interior of the cavity formed by the housing and the PCB is preferably filled up with a goop phosphor or with a transparent encapsulation material, such as a silicone, when the phosphor layer is confined on top of the emitter. The thin PCB may have an interconnect to the backside for electrical connection, but may also extend laterally to be able to solder contact wires to the supply contacts connected to the LED on the top of the PCB outside the housing area.

FIG. 3(d) shows a PSS structure 30 using a phosphor which fills the housing again with a 1 mm package height but with the housing base molded around the LED chip.

FIG. 3(e) shows a DoC structure using a vicinity phosphor as in FIG. 3(d), and FIG. 3(f) shows multiple mid-power LED chips 31 using a goop phosphor as shown in FIG. 3(c), with the chip attached to the electrical contacts at the base of the housing with wire-bond connections. Two mid-power chips are drawn but three or more chips may also be used to generate a sufficient amount of flash light. To accommodate the higher area using multiple mid-power LEDs, the lateral dimensions of the package may be increased.

Apart from the LED types mentioned, also Vertical Thin Film (VTF) LEDs may be used in the examples given, where the LED has one electrical contact at the top of the emitter connected with a wire-bond and one electrical contact towards the backside of the chip for solder attach to the package or a PCB.

Thus, the PSS chip can be mounted in a reflective housing that is either molded around the PSS component, or the chip can be directly soldered to a high reflectivity substrate, such as a thin PCB or a pre-fabricated light mixing package, such as a plastic leaded chip carrier (PLCC) package or similar leadframe component, for instance a QFN package. The latter pre-molded packages are more easily realized than molding packages directly around the PSS chip.

As mentioned above, the invention relates in particular to the design of the one or more microstructured layers which perform the optical processing and its suspension over the LED-based light emitting structure (by which is meant the combination of the bare LED die and any phosphor layer when used for light conversion).

The microstructured layer comprises an optically transparent and thermally stable material, and the support structure supports the microstructured layer (or the base layer if one is needed) at a height of 0.5 mm or less above the LED-based light emitter. The invention may enable the height dimensions shown in FIG. 3 to be reduced, particularly when proximity phosphors are used.

The microstructure can be formed in a polyimide material. The microstructured layers may instead be formed in glass with injection moulding, or using patterned sapphire (or other ceramic) plates.

In some preferred embodiments, the microstructured layer may comprise a silicone (such as a high index silicone) or a hybrid silicone, such as a a methylsiloxane, a methylphenyl siloxane, a phenylsiloxane, an epoxy functionalized siloxane or a high index silicone or mixtures thereof. The regular (i.e. not hybrid) silicone falls into two main types; methyl substituted and methylphenyl substituted, and a third type is phenyl substituted. Hybrid silicones have other groups with additional functionality and typically higher organic content.

A silicone is a material that consists primarily of siloxane groups that are connected into a siloxane polymer chain. The siloxane group consists of $(-O-Si(R_1R_2)-)_n$, which is a repetitive connection of n silicon atoms connected into a polymer chain by oxygen atoms.

The chain may have side groups on the silicon atom, represented by $R_1$ and $R_2$ side groups. For instance, a methylsilicone has methyl groups as side groups, in which $R_1$ and $R_2$ are identical and consist of $-CH_3$ methyl groups.

A methylphenylsilicone has one group $R_1$ consisting of methyl groups and one group $R_2$ consisting of phenyl groups, or consist of repetitive units or blocks of siloxane groups with substituted methyl groups on the $R_1$ and $R_2$ positions and siloxane groups with substituted phenyl groups on the $R_1$ and $R_2$ positions.

Other side group examples are ethyl, propyl, butyl or vinyl. Mixtures of various side-groups within the same siloxane chain may used. The silicone material is usually crosslinked at several positions using groups of other chemical nature present in low amounts. For instance, the siloxane chain may contain vinyl groups, having a carbon-carbon double bond, such as vinyl terminated siloxane chains, with a vinyl group present at the end of the chain. The vinyl group can react with a methyl side group on another siloxane chain using an activator such as a peroxide, in order to link adjacent siloxane chains together to form a network. The vinyl groups may also react with a hydride (—H) group present on the adjacent siloxane chain, such as present on some of the $R_1$ or $R_2$ positions or at the chain ends. Such a crosslinking reaction may be catalyzed by a platinum (Pt) catalyst. The two siloxane chains are then interconnected at the silicon Si atoms via $-CH_2-CH_2-$ bridging groups, originating from the vinyl groups.

A hybrid silicone is a silicone material with increased organic content. This may be realized by introducing hydrocarbon segments or blocks into the siloxane chain, and/or into the side-groups on the siloxane chain. The hydrocarbon part may contain other functional groups, that give the material specific properties. For instance, the hydrocarbon group may be a side-group that contains an epoxy functionality, for instance a cycloaliphatic epoxide group. Such a group is capable of UV-curing to crosslink the hybrid silicone network using a suitable UV-initiator.

As another example, the epoxy functionality may be present in the endgroups of the chain such as in Epoxypropoxypropyl terminated PolyDimethylsiloxane.

The silicone or hybrid silicone resin may also be filled, such as to impact the mechanical properties, for instance by filling the resin with silica particles. Using silica as a filler will retain the optical transparency, though a slight haze/scatter may arise, which may be allowed in the optical function of a thin layer.

In another example, the microstructured layer may comprise a silicate or hybrid silicate or a solgel material, in particular a T-branched or Q-branched material rather than an ionic structure. In contrast to the siloxanes, the silicon atom in this type of silicate or hybrid silicate is connected to adjacent silicon atoms on more than two bonding positions via oxygen atoms. For instance, a pure silicate, such as $SiO_2$ is connected on 4 positions via oxygen atoms to neighboring Si atoms in a network, either in a regular crystalline way, referred to as quartz or in an irregular amorphous way, such as silicate glass. The silicate may also refer to materials that are connected on 3 bonding position on the Si atom to neighboring Si atoms via oxygen atoms. The fourth bonding position on the Si atom may contain various groups, in general referred to as R.

As such this type of silicate may chemically be referred to as $(-(R)SiO_{1.5}-)_n$, in which n in an integer number representing a repetitive connection of the structure. The R group connected to the silicon atom may consist of various chemical groups similar to the two R groups per silicon atom that are present in a siloxane. For instance, a suitable and highly thermally stable silicate is a methylsilicate, $(-CH_3SiO_{1.5}-)_n$. Other chemical side groups may be alkyl groups in general, such as ethyl, propyl, butyl or phenyl groups. The side group may also contain a vinyl, acrylic or epoxy group. As these latter examples are reactive they may function as groups that allow the layer to be cured via these groups, for instance by UV light using a suitable photoinitiator. These silicates with a higher content of organic, carbon containing, groups may be referred to as hybrid silicates. Various side groups may be combined within the same layer.

The layer may be reinforced, or filled, with small particles, such as to be able to realize a thicker layer without crack formation. The added particles are typically nanoparticles, that allow the layer retain transparency provided that these particles are sufficiently small, for instance smaller than 100 nm in diameter and well dispersed inside the layer. An example is a layer of methylsilicate that is filled up with silica nano-particles, for instance by 10 to 20 vol %. A fine micro-size of the structure may be preferred in these materials that are more brittle than silicones, to allow structure imprint in relatively thin microstructured layers. For silicones or hybrid silicones the elasticity of the layer usually more easily allows the realization of thick coating layers, such as 100 micron thickness, and therefore also allows the imprint of relatively coarse pitched microstructures.

The silicate layer may be deposited on a base carrier layer, similar to the silicones. This is preferably done via a liquid coating process of suitable precursor materials. Such a process is typically referred to as a sol-gel process, in which the precursor material is a liquid that is usually dissolved in a suitable solvent and coated on the base layer. Upon drying the layer the sol or solution will react and via an intermediate gelation phase will react to the solid silicate, which is accelerated by increasing the temperature and is usually catalyzed either by an added acid or an added base. During this sol-gel process the layer may be patterned by impressing the layer with a suitable stamp in the liquid or gelled state. Depending on the solvent type and amount the stamp may take up and remove the solvent from the layer. The master stamp may for instance be a silicone stamp that allows take-up and removal of solvent via diffusion. A general representation of suitable precursor materials may be metal alkoxides. For instance, in order to obtain a solid layer of methylsilicate via a sol-gel process a solution of methyltrimethoxysilane, which is a silicon alkoxide, is dissolved in acidic water. The acid may for instance be maleic acid or acetic acid. The alkoxide will become hydrolyzed, resulting in the formation of methyltrihydroxysilane and methanol upon full hydrolyzation. After coating and drying the hydroxyl groups condense to form the silicate network and water is formed as by-product in the reaction.

Other sol-gel materials, apart from silicon alkoxide, derived from metal alkoxide precursors may also be used, for instance, aluminium alkoxides or zirconium alkoxides or titanium alkoxides or mixture thereof.

A commercial example of sol-gel materials are the materials sold under the trade name Ormocer, which consist of a family of materials that are deposited from liquid state via a sol-gel process. Various material types exists, typically using the metal alkoxide precursors as described above. The materials may be functionalized with UV-reactive groups, such as acrylic or epoxy groups, to allow UV-polymerization or UV-patterning.

Sol-gel derived materials, such as the example above of a layer of methylsilicate derived from methyltrimethoxysilane monomers, are intrinsically more stable than silicones. This is due to the three folded network formation via the oxygen bridging groups. These materials can withstand prolonged exposure to 300° C. or more, where regular silicones, connected via two oxygen on Silicon will fail.

The microstructured layer may be self-supporting. If not, it may be provided over a base layer. The base layer also needs to be thermally stable, and may for example comprise a polyimide or a heat-stabilized PEN.

The microstructured layer or layers can be manufactured by creating a master stamp, for example in a polycarbonate sheet via laser patterning. The master stamp can then be replicated in silicone to form a negative of the master. This second master is then imprinted into a liquid silicone precursor layer that is coated to a thin base foil, cured to a solid layer and released from the silicone master stamp. Such a master may also be plated and covered with a metal, such as nickel to obtain a metal replicate master of the original. Alternatively, the master may be manufactured by precise cutting/machining of a metal part to produce a metal master.

The metal master plate may be replicated by coating a layer of liquid pre-cursor material, such as a silicone liquid onto a base foil carrier support.

The silicone may be thermally cured and released from the master. Alternatively, the coating liquid may be a UV-curable silicone material such as commercially available from silicone suppliers. By UV light exposure the layer is cured to such an extent that it can be released from the master with a fixed microstructured shape. Subsequently the layer can be further cured thermally in an oven to realize a full cure of the microstructured layer.

Apart from these batch-wise processes, it is also possible to manufacture the foils on roll-to-roll coating equipment, as is common in the production of optical films, such as brightness enhancement films used in liquid crystal displays. In such a set-up, a roll of base foil is pulled through a roller system and coated with a thin liquid layer of the coating precursor for instance using slot-die coating. The roll is then contacted with a rotating drum that contains the master structure, for instance a nickel master. By flashing with UV light the precursor is cured upon imprint contact with the drum to form a solid microstructured layer. Standard UV-cure acrylates may be used. However, to obtain a high thermal stability a silicone, such as a UV curable silicone or a hybrid silicone material may be used, for instance a silicone-epoxy material.

The base foil (when used) can be a polyester such as PET or PEN. Heat stabilized PEN shows the better resistance to thermal cycles. A transparent polyimide foil such as Neopulim (Trade Mark) of Mitsubishi Gas Chemical Company (Trade Mark) is however preferred as this allows the cap formed by the beam shaping optics to withstand even more the high temperatures during reflow soldering of the package as it withstands short term exposure to high solder temperatures of about 260 degrees. Alternatives for the base foil are flexible glasses, for example Corning (Trade Mark) Willow Glass, or a thin and flexible sapphire. Other transparent ceramics are also possible such as thin alumina, or YAG or LuAG or spinel.

To obtain a proper adhesion between the base foil and the structured layer into which the microstructure is replicated or embossed, an adhesion promoting intermediate layer may be applied. Typically this adhesion promoter is coated as a thin film onto the base foil. The adhesion promoter may contain reactive chemical groups that may react to the base foil or a pre-activated base foil, for instance by using an UV-ozone treatment or oxygen plasma or corona treatment of the base foil. Also the adhesion promoter layer may contain reactive groups that may react with a silicone or hybrid silicone coating layer, such as hydride groups or carbon-carbon double bonds.

The adhesion promoting layer is a layer that interfaces the base layer with the microstructured layer in order to obtain sufficient adhesion between both layers. This layer may be a thin layer of typically a few microns up to tens of microns thick, or be very thin, such as a sub-micron layer, for instance a few hundreds nanometers thick. In principle, the adhesion promoting layer may also be as thin as a monolayer thick of the adhesion promoting material.

The adhesion promoting layer may consist of the pure adhesion promoting material itself, a mixture of adhesion promoting materials, or a mixture of the adhesion promoting layer dissolved or mixed in a binder layer, such as a silicone or siloxane material. A general example of a suitable adhesion promoting material is a silane coupling agent, such as $R_1$—$(R_2)$—Si—$X_3$. In this general formula, the R1 group stands for an organofunctional group, the $R_2$ group represents a linker group, Si stands for the silicon atom of the silane, and the X group represents a hydrolyzable group.

When the hydrolyzable part is represented by $X_3$ this means that 3 such hydrolyzable groups are linked to the silicon atom. However, it is also possible that only 2 such groups are present, represented by $X_2$ or that only one hydrolyzable group is present, represented by X. In the latter cases, the lacking bonds to the Si atom are compensated for by other groups, for instance, by methyl (—$CH_3$) groups bonded to the Si atom. The hydrolyzable group X consists, for instance, of alkoxy groups, such as methoxy, ethoxy, propoxy or butoxy groups; or of acyloxy groups; or of halogen atoms, such as Cl, or of amine groups. These groups can react with water, hence be hydrolyzed, to form silanol —Si—OH groups on the adhesion promoting material. This may occur for instance during the processing of the material, where the water pick-up may come from ambient moisture, the presence of moisture on the coated surface or by added moisture.

The silanol groups can react with a wide variety of oxide or oxidized surfaces, for instance with other silanol groups present on the surface or with oxide or oxidized surfaces of the base layer or hydroxyl —OH groups generated on the base layer.

The silane may also contain two Si atoms instead of one, which is called a dipodal silane. When this silane has three hydrolyzable groups per Si atoms, this means there are in total 6 anchoring silanol groups per molecule after hydrolysis for enhanced anchoring to oxide or polar surfaces.

The $R_1$ group may contain functional groups capable of reacting with the siloxane chain to form a covalent bond or groups that resemble the siloxane chain to improve adhesion by enhanced physical interaction. For instance, the $R_1$ may contain a hydride group, a vinyl group, an amine group or an epoxy group, or a siloxane group. One preferred example is a vinylsilane, such as Methylvinyldiethoxysilane or Vinyldimethylchlorosilane, which reacts with hydride functionalities that are present and common in 2-component silicones to form a chemical bond.

The linker group $R_2$ may consist of a wide variety of groups. Typically this linker of spacer group is a hydrocarbon chain represented by —$(CH_2)_n$—, where n is an integer. For example short linker such as a methyl (—$CH_2$—) or propyl spacer group (—$(CH_2)_3$—) or a long hydrocarbon spacer chain, such as a decyl group (—$(CH_2)_{10}$—). A longer linker group will give more flexibility/mobility in the molecule. It is not essential that the linker group is present, it may also be absent, such as in the above mentioned examples of the vinylsilanes. The silicone or hybrid silicone layer containing the microstructure, may consist of siloxane chains with functionalized groups, such as reactive groups that can interact with the adhesion promoter, usually on the $R_1$ group or on the X group. For instance, the siloxane chain may contain vinyl groups or hydride groups, such as common in 2-component addition cure silicones, or silanol groups, such as silanol terminated PolyDimethylsiloxanes, which are common in 1-part silicone condensation cure materials, or amino groups, for instance aminopropyl terminated PolyDimethylsiloxanes.

Other functionalities may include amine functional siloxanes or epoxy functional siloxanes. Yet other functional groups may include alkoxy groups, or acetoxy groups. Combinations of various functionalities may also be used.

These reactive groups are typically present in the precursor or liquid state of the silicone material, while applying the silicone material, e.g. by coating or casting of the silicone material on the base layer. By curing the silicone precursor, a solid silicone layer is formed. Simultaneously, the bonding to the adhesion promoting layer will occur for compatible functional groups.

Other adhesion promoting materials apart from silanes may include titanates or zirconates. These are typically more reactive than the silane functionality. For instance, alkoxytitanates may be used or titaniumacetylacetonates. For instance, Tetraethyl titanate may be a suitable adhesion promoter. These can be incorporated or mixed into a siloxane binder and deposited as an adhesion promoting layer. Also the adhesion promoters may be mixed for enhanced performance, for instance the titanate may be mixed with a silane, such as a vinylsilane.

The adhesion promoting materials may be mixed with a suitable solvent to facilitate deposition of the layer.

A low concentration of the adhesion promoter molecules may also be added to the silicone or hybrid silicone resin that forms the microstructured layer. This may be sufficient to allow improved adhesion to the base layer, without needing a separate adhesion promoting layer, though a separate interface layer is generally more effective.

In order to create anchoring groups on the base layer for the adhesion promoter to react to, a surface treatment, known to those skilled in the art is likely to be required, such as a corona treatment, UV-ozone treatments, oxygen plasma treatment or a flame treatment. For instance, when the base layer is a polyimide, such a surface treatment is desired to activate the surface by oxidation for enhanced anchoring of the adhesion promoting layer.

Figure 4:
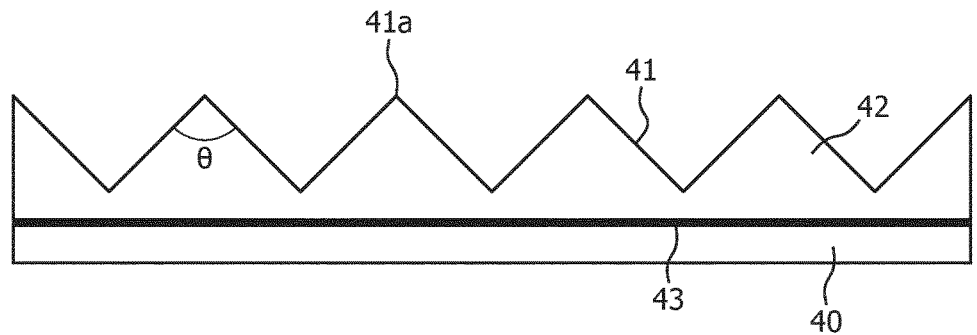
FIG. 4 shows the possible structure of one microstructured layer.

FIG. 4 shows the design of one microstructured layer in the form of the base layer 40 and the microstructured layer 42 of the forms as described above. The optional adhesion promoting layer is shown as 43.

This example has a structure in the form of a set of parallel ridges 41 which perform a collimation function. Each ridge has a peak 41a. FIG. 4 shows the top apex angle θ at the apex or peak 41a of the ridges, which can for example be 90 degrees or 100 degrees, or indeed other angles for example within a range 70 to 130 degrees. In preferred embodiments, the ridge sides are symmetric as shown.

The ridges have planar sides, rather than curved lensing surfaces, and this means the distance between the light source and the microstructured layer is not critical to the optical function.

The ridges 41 in the example shown are linear and thereby form a one dimensional repeating structure. There may instead be a two dimensional repeating structure, thereby forming a two dimensional array of prism like structures. The prism like structures may not be arranged in straight lines, and may instead be arranged along curved paths.

The ridges may all be of the same design, namely the same top apex angle, the same width (i.e. in the left-right direction in FIG. 4) and the same height (from peak to valley). Each ridge micro-element may be illuminated with the full angular source spread of light and each element will then provide the desired beam pattern. A repetition of structures with the same top apex angle may hence cover the entire source area to enable an optical output window that provides the desired beam shaping. The repetition pitch and height of the structure may in principle vary for the same top apex angle and results in a similar beam profile.

This collimator design, in combination with the use of materials with suitable thermal characteristics, enables the desired reduction in height of the overall package, whilst enabling the optical collimation function to be effective as well as maintaining the ability to perform reflow soldering of the package.

As one example from the range of examples given above, a low refractive index silicone (methyl silicone type for example, such as methylsiloxane) can be used as the structured layer 42 with refractive index n=1.41. The silicone materials give excellent photo-thermal stability for LED applications.

An alternative from the range of examples given above is a methylphenylsiloxane type with a refractive index of 1.51-1.53. In general the microstructured layer may typically have a refractive index of 1.3 to 1.65 for implementations using air gaps. Also, even higher index silicones, for instance a high index silicone with a refractive index of 1.61 may be used. Such high index silicones are typically specially developed for instance by adding high index nanoparticles to the silicone or by introducing specific atoms in the siloxane chain that increase the refractive index.

The base layer 40 is primarily selected to meet the desired structural properties and thermal stability. The refractive index of the base layer is less important since the interfaces of the base layer are parallel to each other and finally do not influence the light ray direction. However a lower refractive index is preferred so that Fresnel reflections at the air interfaces are minimized.

As one preferred example from the range of examples given above, the base layer can be a polyimide layer.

The shape of the microstructured optical elements in this example is hence a prismatic groove structure that extends in the depth direction of the cross-section.

The outer shape of the unit can take any suitable form, for example enabling a logo or other symbol to be visible at the light emitting surface. The entire housing can instead be designed with a desired aesthetic shape. Of course the periphery can simply be square or rectangular, triangular, an elongated strip, a ring shape or any other shape without changing the beam pattern.

Figure 5:
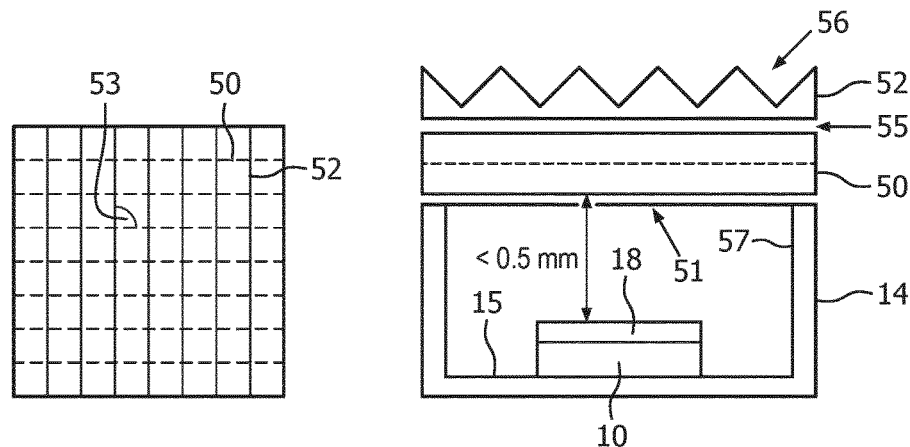
FIG. 5 shows the LED flash structure with one example of beam shaping collimator design more clearly shown.

FIG. 5 shows an LED flash unit with one example design of the beam shaping optics more clearly shown. The beam shaping optics has a first microstructured layer 50 over the open top 51 of the support structure (i.e. the housing 14), and a second microstructured layer 52 over the first. They each have a structured layer which provides a regular array of elongate parallel ridges facing away from the light source. The left image is a plan view of the prism orientations, with the top prismatic structure 52 in solid lines and the bottom prismatic structure 50 in dotted (hidden) lines, and this shows that the ridges are crossed with a crossing angle 53. The right image shows a cross section through a vertical plane, i.e. perpendicular to the substrate. FIG. 5 also shows the side walls 57 defined by the support structure (i.e. the housing), and these are also reflective.

The two layers 50,52 have the same design features as explained above with reference to FIG. 4. Thus, the ridges have planar sides, rather than curved lensing surfaces. Within each layer, the ridges may all be of the same design, namely the same top apex angle, the same width (i.e. in the left-right direction in FIG. 4) and the same height (from peak to valley). The two layers may also have the same design as each other.

The example of FIG. 5 is for an LED-based light emitting structure in the form of a blue LED 10 with phosphor 18 over the LED die. The 0.5 mm height limitation enabled by the invention is in this case the distance between the top of the phosphor layer 18 and the bottom of the first microstructured layer of the beam shaping optical arrangement 50,52 as shown.

In the case of a goop phosphor (as shown in FIGS. 3(c), (d) and (f)), the height requirement relates to the spacing between the top of the goop phosphor and the first microstructured layer of the beam shaping optical arrangement. In such a case, the LED-based light emitting structure comprises the LED and goop phosphor. An important aspect is to enable the unit with integrated optical beam-shaping function to be reflow soldered, but the use of a thin phosphor goop again enables the overall thickness of the unit to be reduced. However, to reduce the thickness to a minimum, a proximity phosphor is preferred as shown in FIGS. 2(a) and 3(a).

Two orthogonally aligned layers (as shown) may be used to achieve collimation in both directions. However the orthogonal orientation shown is not essential. The ridges of the two layers can for example cross with an angle of 30 to 150 degrees, more preferably 50 to 130 degrees, more preferably 70 to 110 degrees.

The reduced spacing to less than 0.5 mm is shown. At the limit, the beam shaping optics can be applied directly to the LED (if no phosphor is to be used) or the phosphor layer over the LED die. Thus, the spacing may be less than 0.4 mm, or even less than 0.3 mm.

The layers are separated by a layer 55 which can be an air gap, although this layer 55 can be a different material (such as a glue) but again of substantially lower refractive index than the structured layers. This requires a higher refractive index of the structured layers than when air gaps are used. The top (second) layer is also covered by a material layer 56 which may be the same as the layer 55, for example air, or glue which is used to bond a planarizing protective layer on top.

Essentially, the structures need an optical contrast to function. If the layers are glued together the index of the structured layers will need to be increased and the index of the optical bond needs to be low. A glue of index 1.4 can be found, so that in a first approximation the increase of air refractive index 1 to glue index of 1.4 needs the index of the optical structured layers to increase by 0.4 as well, to the within a range 1.70 to 2.05. This maintains a refractive index difference in the range 0.3 to 0.65.

Typically the glue will have a refractive index in the range 1.3 to 1.6.

Light escapes from the housing at the top towards the microstructured layers. Depending on the refractive indices and micro optical structure of the microstructured layers, part of the light may be collimated and part may be retro-reflected towards the highly reflective housing by means of total internal reflection, where the light is recycled. The recycled light can escape again by the same mechanism. The efficiency depends on the reflectivity of the housing, Fresnel losses at the interfaces between different media and absorption in the media.

Figure 6:
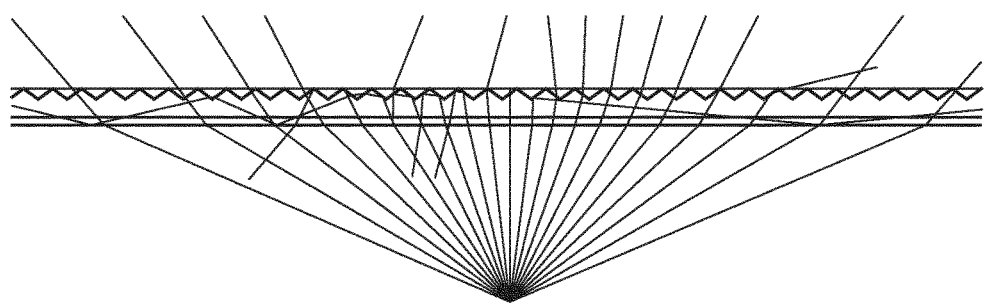
FIG. 6 shows a simulation giving the effect of one microstructured layer on the light ray directions from a point light source.

FIG. 6 shows a simulation giving the effect of a single microstructured layer on the optical output from a point light source.

Depending on the angle of incidence, the refractive index (difference) and the top apex angle of the ridges (prisms) some rays will be reflected back due to total internal reflection while other rays may escape at the top surface. The smooth surface of the microstructured layer is directed towards the light source. The angle of incidence is determined by the light source size, its position and distance from the beam shaping optics. Usually for remote phosphor architectures (FIGS. 2(c) to (e)) the emission profile is close to Lambertian, whereas for LEDs with a proximity phosphor, the angular distribution of the rays impinging the microstructured layer may be slightly more directional, but in all practical cases will not deviate significantly from a Lambertian distribution. The parameters of the system that can be varied are hence the top (apex) angle of the prisms and the refractive index of the material.

The size of the air gap between the housing base (where the LED is located) and the microstructured layer 50 (or the bottom microstructured layer of a stack) is kept as small as possible to make the whole module as thin as possible.

In particular, the air gap is less than 0.5 mm, and more preferably less than 0.2 mm, such as around or less than 0.1 mm.

To guarantee a thin air gap and prevent sticking of the lower microstructured layer to the housing, small spacer structures may optionally be applied in low density, such as small spherical or rod particles or support poles to prevent two components to touch each other over large areas. Similarly, such spacing structures may be designed on the microstructured layers to reduce the likelihood of optical contact between the structured layer of the lower layer 50 and the backside of the upper layer 52. For instance, superimposed to the optical ridges a low density of poles may be designed that slightly stick out, such as 10 to 25 microns in height, on top of the height of the optical ridges. This prevents the flat side of the top layer 52 from touching the top of the microstructures. Such a spacing may also be applied to the backside of the top layer 52, for instance in the form of stripe shaped spacer structures that are aligned roughly perpendicularly to the ridges of the lower microstructured layer 50.

To protect the micro-optical surface structure on the top of the device from scratches and damage in handling and use, an optional protection sheet may be added on top of the structure, typically a transparent sheet, for instance a transparent polyimide sheet.

The housing is soldered to a circuit board to enable drive signals to be provided to the LED. The examples above show a housing with reflective base and side walls to provide efficient recycling of light. However, this is not essential.

Figure 7:
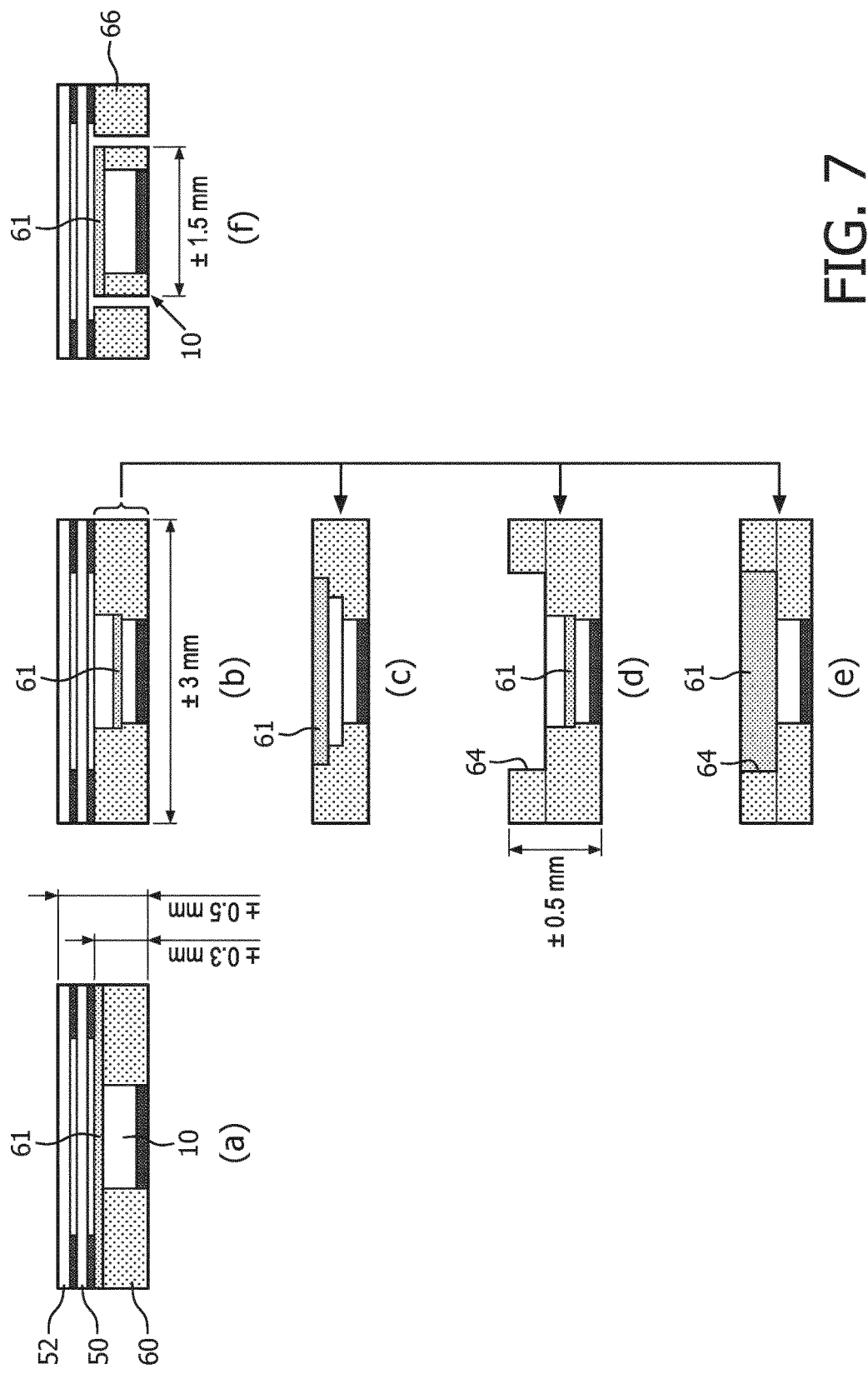
FIG. 7 shows various examples of a LED flash component with very low build height that is realized in various package constructions on a PSS emitter.

FIG. 7 shows various alternative packages.

FIG. 7(*a*) shows a package without side-walls and without PCB. The blue LED chip 10 consists of an epitaxial layer on a carrier substrate such as sapphire with back side contacts, for example a flip-chip architecture. The LED chip 10 is surrounded by a reflective layer 60, such as a white silicone molding, that forms the housing and therefore the support structure. A phosphor coating 61 covers this package and the optical structure layers 50,52 are attached to this package at the periphery, with an adhesive.

Note that in all examples of FIG. 7 the phosphor is shown as 61, even though different phosphor types are shown.

The adhesive forms layer 55 in FIG. 5 and is used to attach the two microstructured layers 50,52 to each other as well as to attach this assembly to the package. This adhesive may be a glue, cured from a liquid state to a solid state, or be a piece of adhesive tape. The adhesive tape may be a tape that is thermally cured or be a tape that is UV-cured after connection of the parts.

FIG. 7(*b*) shows an alternative package in which the phosphor layer 61 is restricted to the emitter area or is only slightly larger than the emitter area.

In FIG. 7(*c*) the phosphor 61 is larger than the chip but smaller than the outside dimensions of the package and there is a distance between the emitter and the phosphor layer, to define a vicinity phosphor. This gap is typically filled with a transparent silicone.

In FIGS. 7(*d*) and 7(*e*) a rim 64 is molded onto the package, thus forming a cavity with a side-wall. In FIG. 7(*d*) this cavity is empty or alternatively filled up with a transparent material, such as a silicone. In FIG. 7(*e*) this cavity is filled with at least a single phosphor layer containing at least a single phosphor material, for instance a powder phosphor material embedded in a silicone material.

FIG. 7(*f*) shows a flat LED package 10 including phosphor 61 that is capped/covered by the optical foil assembly on a frame 66. The frame 66 is placed around the package, either with a gap, or the frame is bonded around the LED package, for instance by filling up the gap between the package 10 and the frame 66 with a transparent silicone or with a reflective silicone.

The packages of FIG. 7 may have back side contacts to be able to solder these packages to a PCB by the customer. Alternatively these packages may already be pre-attached to a thin PCB backside. This backside PCB may extend beyond the LED package area. On the PCB an ESD protection diode, such as transient voltage suppressor, may be attached to prevent the flash LED assembly, also called a flash LED module, to be damaged by electrostatic discharge. Alternatively, this protection diode may be integrated inside the LED package, such as inside the reflective wall or reflective periphery or, least preferred, inside the cavity.

Figure 8:
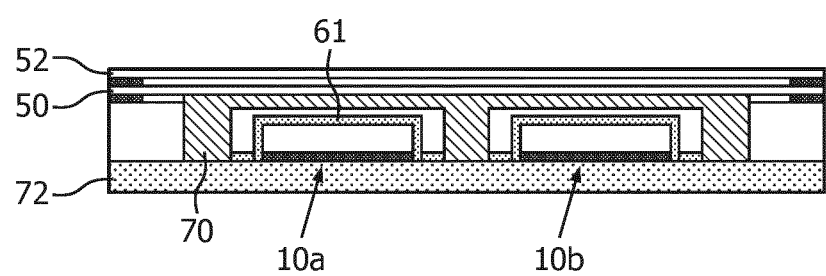
FIG. 8 shows an example of a multi-LED emitter flash component in one package.

As another example, multiple LED emitters can be used inside the same package and covered by the same optical beam shaping structures into a compact multi-LED emitter, as shown in FIG. 8. The emission color of the flash can be controlled by controlling the current ratio between the two LEDs with different white colour temperatures.

FIG. 8 shows two LED packages 10*a*,10*b* with different colour temperatures on a shared substrate 72. Each LED package has its own phosphor layer 61 and there is a transparent fill 70 to form a single overall structure.

The LED unit can then controllably be made to emit multiple colors depending on the desired image perception. For instance, a first LED can emit cool white, of for example 6000K, whereas a second LED can emit warm white, of for example 2700K. As a consequence, the image taken with the camera can be stored in a cool or a warm scene setting depending on the wishes of the photographer. As both LEDs can be put into the same package, this dual channel flash can become very compact and for only the cost of one package, instead of requiring two separate flash LED units, each with a Fresnel lens, which saves space and the high cost of two lenses.

As the beam shaping optics on top of the shared package also has a light mixing capability, a joint operation of both LEDs with controllable current ratios between the channels still allows a very good light mixing of the emitted light distribution, even at small distances to the package. The controlled current ratios allow precise tuning between the extreme color temperatures of the individual LEDs.

Similarly, a third channel may be added to span a color tunable color space, for instance to be able to deviate the color point from the black body radiator, such as a third package with an intermediate colour temperature above the blackbody line. Similarly, a fourth channel may be added, or in general a multi-channel package may be realized in the same package.

It is mentioned above that the package can be shaped to give a desired aesthetic appearance. This appearance can be obtained by light blocking outside the desired shape. One way of blocking the light is to add another reflective component, such as a white reflective foil or a specular reflecting mirror foil, with a stamped out shape on top of the beam shaping optics. As such, the outer periphery of the optics may not be shaped, but any shape may then be applied by using the partially blocking or reflecting layer covering the beam shaping optics.

The light that is blocked is preferably recycled using a highly reflective material that faces the optical layer. The light that is blocked/reflected will get another chance to escape after interaction with the beam shaping optics and the packages where it may be sent back to the light blocking/reflecting layer shifted in position to be transmitted through the shaped opening(s).

Another way of creating a desired shape is by covering the microstructured layers, for instance the top layer, with a reflective material. For example, the top layer may be partially covered by dispensing or printing a white reflective material, such as a white silicone layer, on the layer, which will locally fill-up/cover the micro-optical surface structure. The blocking layer, either as a separate layer or as a layer that is deposited on the microstructured layers, may be placed on top, in-between the top and the backside of the beam shaping optics. When the blocking layer is used in-between the microstructured layers, it may also have the function to bond the layers together into one foil assembly, retaining a gap between the microstructured layers at the areas where the light is transmitted with the desired beam profile.

In these ways any desired shaped may be superposed over the emitter, to give a desired appearance of the device in the off-state or at dimmed operation of the device, not blinding the viewer.

As mentioned above, it is known to apply a scattering layer to conceal the yellow appearance of the phosphor. This can be applied to the examples above, particularly those using a goop phosphor which fills the space of the housing.

The examples above make use of arrays of parallel and straight ridges on each microstructured layer. These ridges may have uniform pitch across the area of the surface. However, this is not essential, and the pitch may locally vary. In this case, the pitch is irregular. One potential benefit of providing an irregular pitch is that it can result ridge height differences. The highest ridge tops of the lower structured layer can then be used to function as spacers to support the top structured layer while permitting a low optical contact area between the two layers.

The ridges do not need to be straight or continuous. For example the area of the microstructured layers may be divided into areas, with ridges extending in different directions within those areas, for example forming a checkerboard pattern. Within each local region, the ridges of the two layers cross at the desired angle to provide the desired collimation in two different directions.

The apex angle is typically constant for the whole of each structured layer. However, this is not essential, and the apex angle may vary across the layer. This variation will typically only be small, for example within 5 degrees, so that all apex angles are within a given range (such as 90 to 110 degrees).

The compact lighting unit typically has an aperture with a diameter of less than 8 mm, although the arrangement enables the device to be increased in size without a corresponding increase in thickness.

As discussed above, the housing may be made to be reflective. In particular, it is more reflective than the LED chip. A diffuse reflection property is preferred to a specular reflection, so that light leaves the housing with as few internal reflections as possible. A white silicone can form the diffuse reflecting surface.

The examples show two microstructured layers. However further optical layers may be provided, for example for colour control. Furthermore, a third microstructured layer may be used as part of the collimation function.

Furthermore, as made clear above, the structure can be applied to a single layer, and the optical function does not have to be collimation. Other beam shaping functions, such as a lens function, can be implemented.

One area of interest is flash LED applications for mobile phones. The flash LED module can also be used for picture camera flash on photo cameras or video cameras or as part of a flash component integrated in other devices, such as tablets.

There are however numerous other compact lighting applications which can be considered, for instance in spot lamps. The component can be used generally in applications where specific light beam intensity distribution is required. Currently this function is realized mostly in secondary optical components. The invention enables the beam shaping function to be moved to the primary optics, directly on the LED, while enabling the component to withstand reflow soldering processes.

Some examples of possible applications are:

downlights for example for office lighting, with a pre-collimated but broad beam distribution;

lighting applications with light distributions giving reduced glare, for example office lighting in which suppression of light emitted at the angles greater than a threshold (e.g. 60°) from the normal may be desired;

lighting applications providing a bat wing type distribution, for example for office, industrial and outdoor lighting; and other directional/asymmetric light distributions, for example for pedestrian crossing illumination.

In many of these applications, the lateral width of the component, the amount of LEDs used and the total amount of output light may be larger than required for mobile phones. Apart from flash pulses for photos the unit can also operate continuously for video flash.

Figure 9:
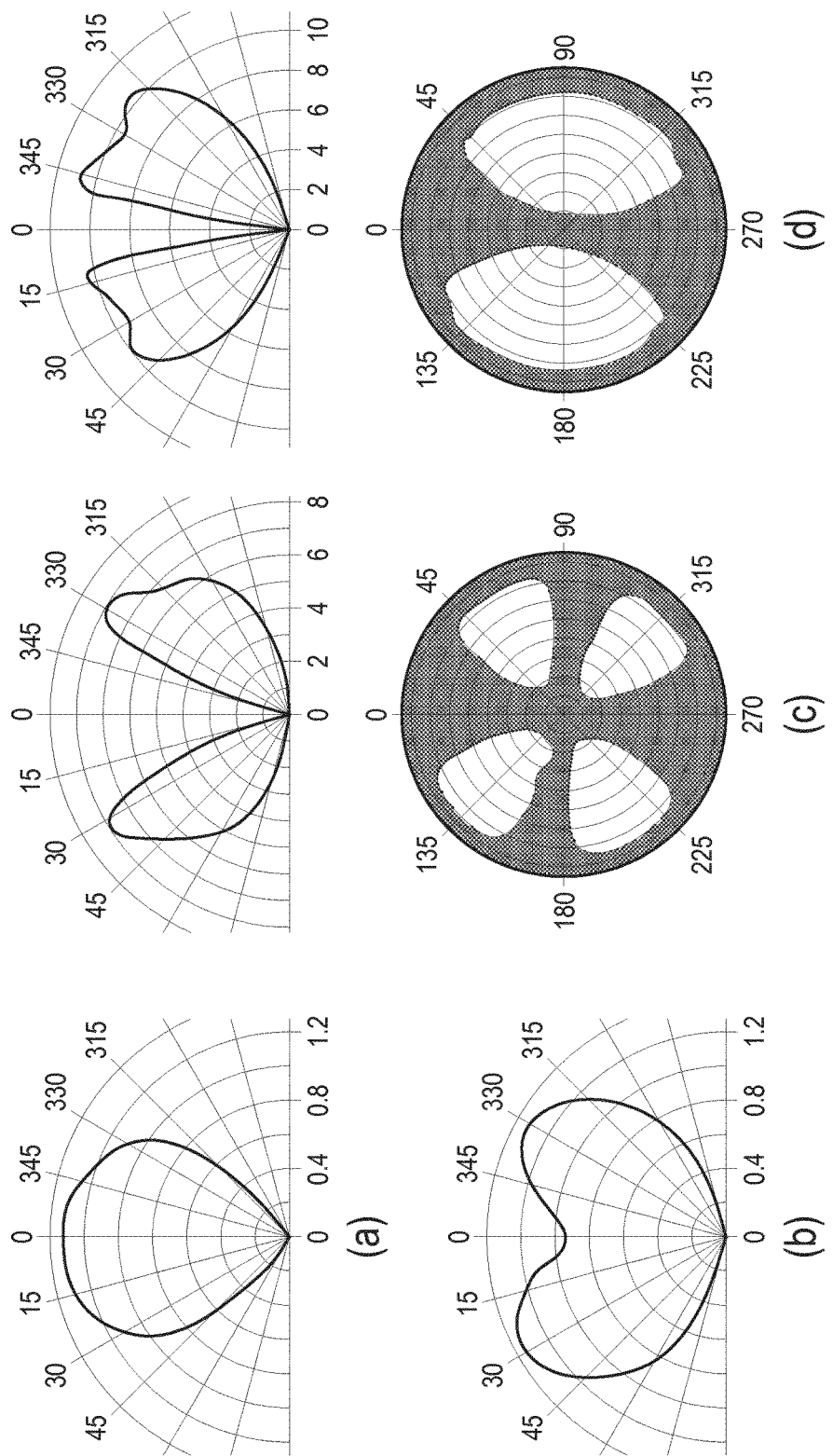
FIG. 9 shows some optical beam shaping functions which can be implemented'

FIG. 9 shows some possible desired optical functions, showing the intensity as a function of the emission angle to the normal.

FIG. 9(a) shows an intensity characteristic giving reduced glare.

FIG. 9(b) shows an intensity characteristic giving a batwing distribution. FIGS. 9(a) and 9(b) may be rotationally symmetric. However, non-rotationally symmetric functions are also possible as shown in FIGS. 9(c) and 9(d) in which the rotational asymmetry is also shown.

The microstructured layer may face away from the LED 10 or it may face the LED 10. These two possibilities are shown in FIGS. 10(a) and 10(b), in which the microstructured layer is shown as 80, and it may comprise a single self-supporting layer, or a combined base layer and microstructured layer, or multiple microstructured layers or multiple microstructured layer and base layer combinations. As shown, a layer 82 is provided over the structured surface of microstructured layer and a layer 84 is provided over the flat surface. As described above these layers may be adhesive layers for example for bonding together multiple beam shaping arrangements, or for bonding the beam shaping arrangement to the LED-based light emitting structure, or for planarization purposes, or for protecting the microstructured layers from damage and contaminations, for defining desired air gaps.

A single layer structure can have for example pyramidal or conical structures.

Figure 10:
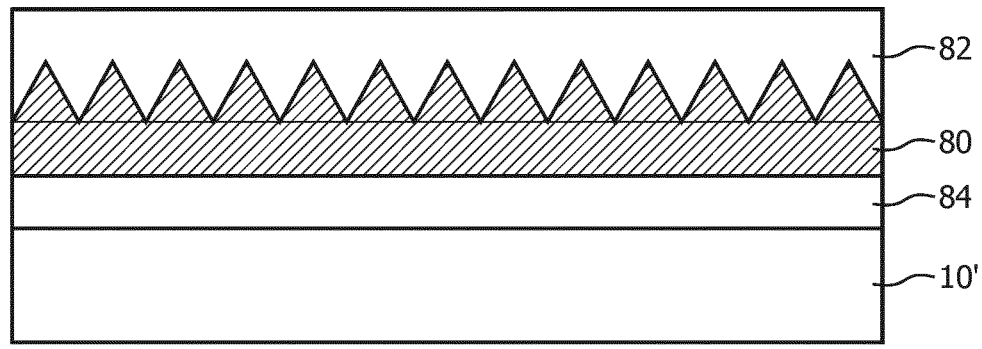
FIG. 10 shows two possible orientations for the microstructured layer of the beam shaping arrangement.
Figure 10:
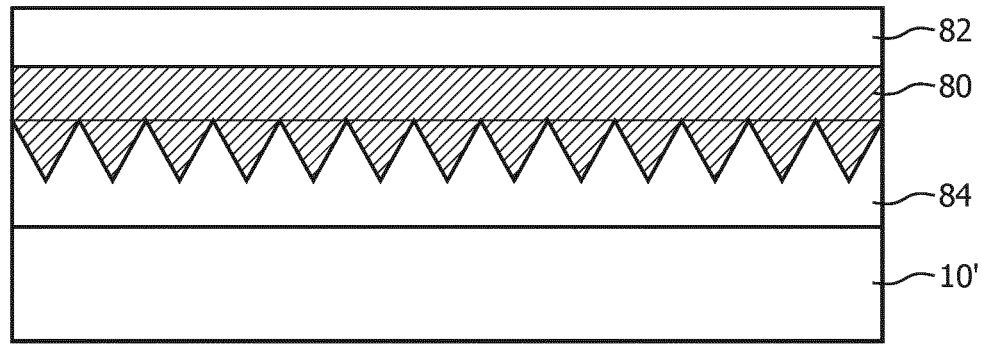

FIG. 10 shows two designs of single-layer structure which use bonding layers 80 instead of providing an air gap. The beam shaping layer is shown as 80. In FIG. 10(*a*), there is a top covering layer 82 which provides protection and planarization. A bonding layer 84 is between the microstructured layer 80 and the LED. The LED layer is shown schematically as layer 10' (in FIGS. 10 and 11)—this represents the complete LED and surrounding package and phosphor.

In FIG. 10(*b*), the microstructured layer 80 has ridges which face downwardly.

The bonding can give better mechanical stability and eliminate possible reliability issues by eliminating the need to maintain and control the air gap. There can be also an advantage in package assembly.

In the case of such bonding architectures, there is still a need to maintain a refractive index contrast between the material of microstructure and the layer surrounding the beam shaping arrangement. This can be realized in several other ways to those shown in FIG. 10.

Figure 11:
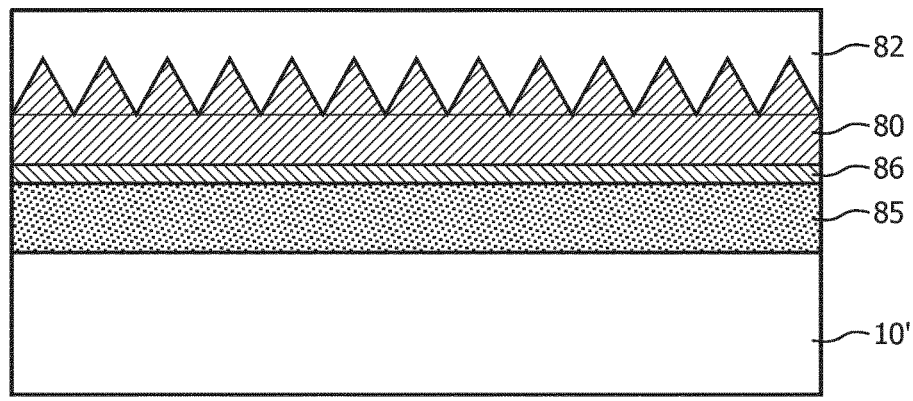
FIG. 11 shows two further possible designs for the microstructured layer of the beam shaping arrangement.
Figure 11:
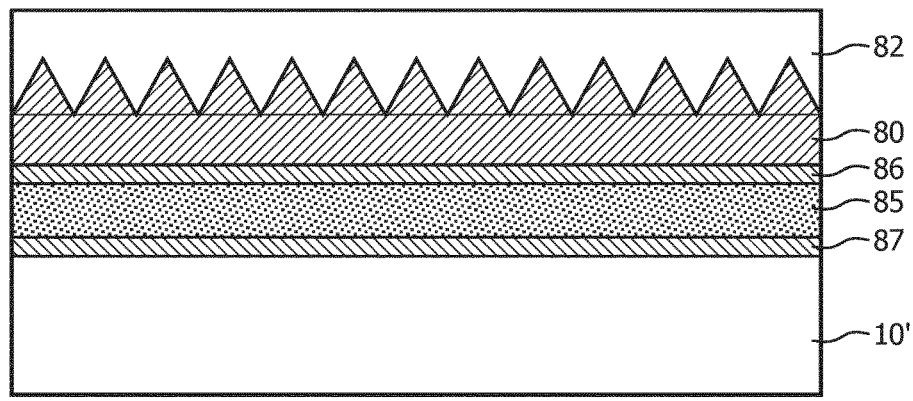

FIG. 11(*a*) shows a low refractive index material 85, such as an aerogel, and a bonding layer 86 between the LED 10' and the smooth side of the microstructured layer 80. The bonding layer does not need to have a low refractive index, for example it may have n=1.4. In this way, there are two layers 85,86 beneath the beam shaping arrangement 80.

FIG. 11(*b*) shows a three layer structure of the low index material 85, the bonding layer 86 on one side (between the low index material and the microstructured layer 80) and a second bonding layer 87 on the opposite side (between the low index material and the LED 10').

Figure 12:
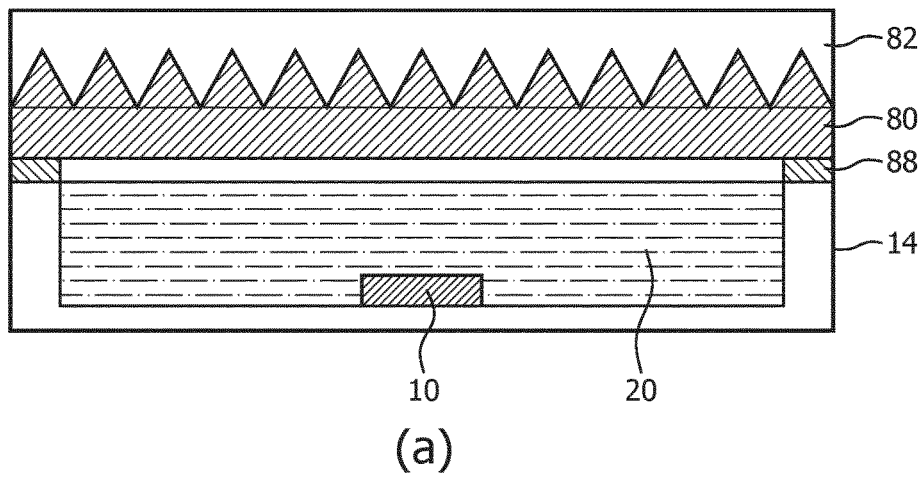
FIG. 12 shows two further possible designs for the microstructured layer of the beam shaping arrangement.
Figure 12:
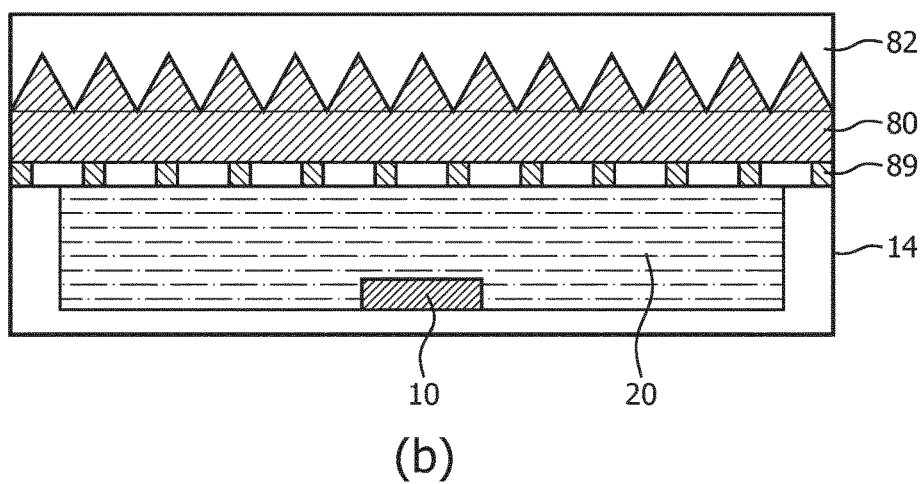

The bonding between the layers does not need to extend across the full area. FIG. 12 shows two examples.

FIG. 12(*a*) shows a partial bonding architecture which has a low refractive index layer in the form of an air gap beneath the beam shaping arrangement 80,82. Partial bonding is implemented using a regular index material bonding layer 88 (n=1.4 for example) with bonding only on the sides of the package. There is no overlap of the bonding layer 88 with the phosphor 20 (or another top surface of the LED 10').

FIG. 12(*b*) shows the bonding layer 89 which forms a set of pillars, again giving partial bonding this time with contact with the underlying phosphor 20 (or other top surface of the LED).

Regular refractive index materials can be used for the bonding layer in this case. An air gap is effectively maintained, for example in the example of FIG. 12(*b*) by using only a relatively small amount of area for bonding. Glue dots can be applied to the top of the LED structure, or alternatively the support structure may be provided on the backside of the base layer 80.

Different design rules may apply in the case of partial bonding. The total overlap area with a phosphor needs to be kept as small as possible. Depending on the particular values of refractive index and the beam requirements, criterion setting the possible area can be derived.

There are thus various designs which make use of multiple layers between the LED and the beam shaping arrangement, with one of these layers being of low refractive index, and this low refractive index layer may be a gas (i.e. air) or a solid (e.g. aerogel).

Figure 13:
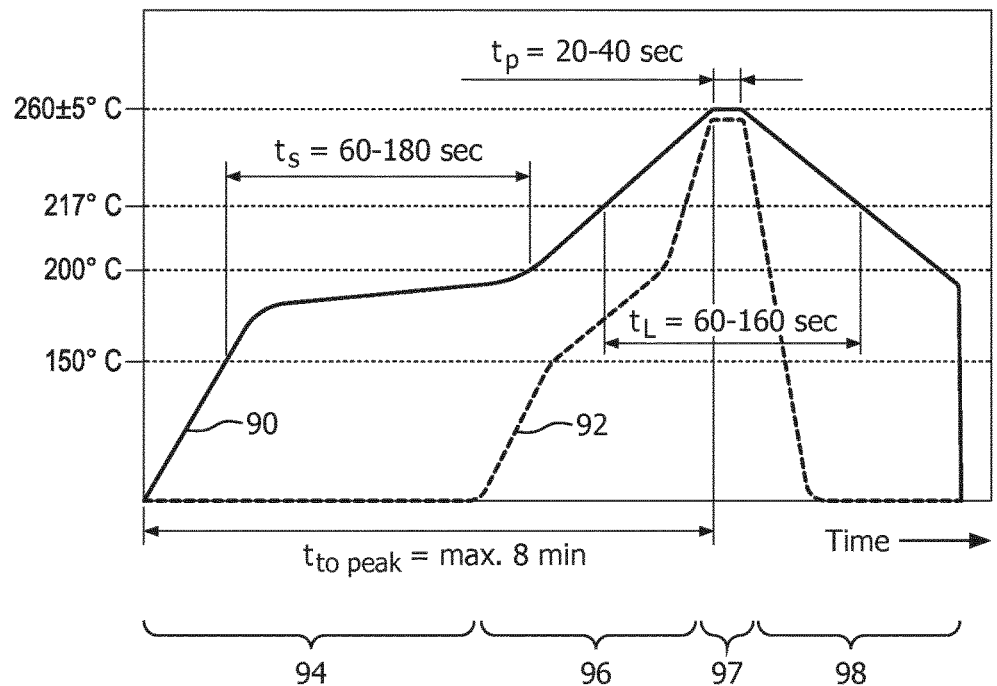
FIG. 13 shows an example of reflow soldering oven temperature profile.

As explained above, the component is designed to withstand reflow soldering. For completeness, an example of the reflow oven temperature profile with respect to time is shown in FIG. 13.

Two extreme curves 90 and 92 are shown. There is a preheat stage 94, a ramp up stage 96 (with maximum slope 3 degrees/s), a peak stage 97 and a ramp down stage 98 (with maximum slope 6 degrees/s).

It is noted that the various materials described in this document are known per se, and their thermal and mechanical properties are also known. For example, suitable silicone materials are widely used in the LED industry for LED packages as a result of their high stability.

The use of suitable materials in this application enables a construction of a foil which is non-stick and reflow solderable, and with a suitable optical microstructure, for example particularly for optical light collimation.

Figure 14:
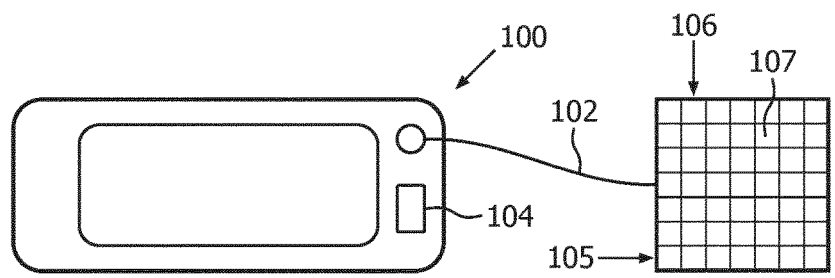
FIG. 14 shows an example of camera using the LED unit as a flash.

FIG. 14 shows a camera, which is part of a mobile portable device 100. The camera has a camera optical sensor 102 and a LED unit 104 of the invention functioning as the flash. The optical sensor comprises orthogonal rows 105 and columns 106 of sensor elements 107 as also shown.

As discussed above, the micro-elements comprise structures having a top apex. To show more clearly what is meant, FIG. 15 shows two possible examples in perspective view.

Figure 15:
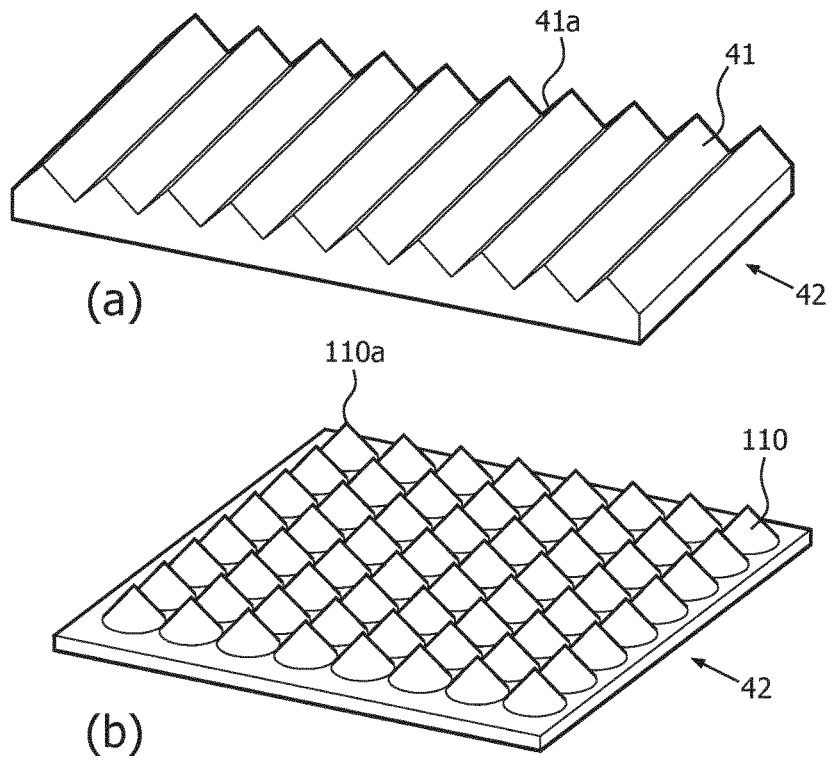
FIG. 15 shows two different designs of optical layer in perspective view.

FIG. 15(*a*) shows a parallel ridge structure as explained in detail above and thus shows the structure of FIG. 4 in perspective view. In this case, there are ridges 41 (or valleys) which extend in a line giving a one dimensional repetition. The ridges have a top apex 41*a* in the form of a line. The ridge sides are planar so they do not have any lensing function. Instead, there is a repeating optical function across the area of the layer 42.

The ridges may be pyramids forming a two dimensional repetition.

FIG. 15(*b*) shows an array of cones 110. These have a single side and they taper to reach a top apex in the form of a point. The points may form a regular grid as shown, but again the cones may be arranged in straight or curved lines. In the case of a cone, the side wall is curved not planar. However, the side extends straight from the base to the apex 110*a*, so again there is no curved lensing surface. In cross section through a plane perpendicular to the layer 42 and which passes through the apexes 110*a*, the sides are straight.

These designs of optical layer 42 perform a light recycling function rather than an imaging function (like a Fresnel lens). The pattern of the optical structures (cones, prisms, pyramids) is repeating and covers the optical window.

Note that for the same apex angle different prism or ridge or cone heights can be used. Hence, the pitch may vary for the same apex angle while changing the height. This gives the same optical effect. For symmetric pyramids there is a single apex angle, however for pyramids with a rectangular base there are two apex angles to consider. With the two apex angles it is possible to control the beam collimation in two perpendicular directions rather independently.

Figure 16:
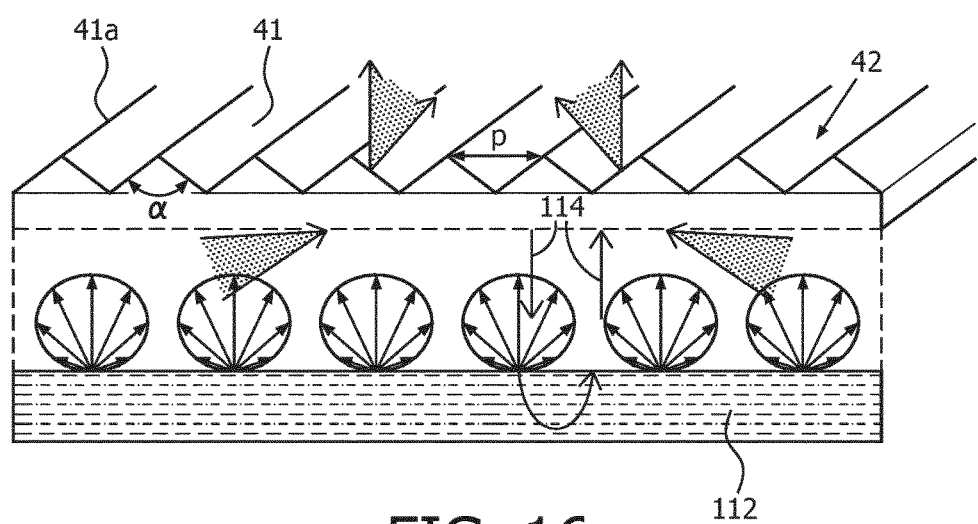
FIG. 16 shows how the optical layer performs an optical recycling function.

The light recycling function of the optical layer is shown in FIG. 16. It shows a layer 42 of the type shown in FIG. 11(*a*). The light source is represented by layer 112. This is the phosphor layer, and it emits light relatively uniformly across its area.

The layer 42 provides on-axis collimation. Each microstructure has a light acceptance cone. The tapered side walls leading to each apex do not allow the passage of normally directed light. This light is recycled as shown by arrows 114 due to total internal reflection at the ridge sides. This applies equally to ridges, pyramids and cones. Thus, there is recycling of light outside the acceptance cone with light closer to the normal of the foil being retro-reflected to the (scattering) light source where it is scattered randomly in other directions giving it another chance to pass through the layer 42.

The LED is beneath (or within) a phosphor layer that partially converts the blue light. The total effect is that white light is emitted from the phosphor layer. This phosphor layer preferably has nearly the same area as the optical layer 42 with microstructures. The LED may also be inserted into a cavity that is white reflective. The result is that the luminance is rather constant over the light emitting area, so that the angle of incidence to the different microstructures across the area is quite uniform over the area of the light source.

As the apex angle (a in FIG. 16) and the material is similar everywhere, the angular collimation distribution is also similar for each micro-element. Even with a non-uniform initial light output, the normally emitted light is recycled as explained above, and then scattered. In combination with the effect of the reflecting housing, a relatively uniform illumination of the microstructured layer 42 results. The micro-elements each form the desired beam pattern so that different spatial areas of the structure direct the incident light in the same way.

In a Fresnel lens different areas are needed such as a refractive lens area and reflective rim areas. Incident light then needs to come in at a particular angular range for the lens to work properly. In the beam shaping arrangement described in this application, the full angular spread of the light source output can incident at all spatial locations.

In turn, this means the design is not sensitive to the alignment of the LED at the center of the device. The LED can be placed at different locations within a cavity for a similar effect. Also, multiple LEDs can be provided within the cavity for example for more output power at the same distribution.

For a Fresnel lens the emitter needs to be placed at the optical axis of the lens and it must be small in size compared to the lens. A Fresnel lens also enlarges the LED emitter. For a phosphor converted LED this typically gives an increased yellow appearance. By using recycling optics instead of focusing optics, the direct LED image is suppressed (since normal light angles from the LED are reflected). Off-normal angles are mainly transmitted that create an 'image' of the interior of the cavity, that may be white or contain a phosphor of a low concentration/yellowness compared to a phosphor directly over the LED. Hence, the yellow appearance in the off-state of the device can be reduced.

Covering the flash module with a shaped aperture (for example shaped as a company logo) does not affect the beam shaping function as a result of the distributed optical function explained above. The efficiency will of course be reduced. With a Fresnel lens the beam shape would be affected by allowing only a partial shape to be transmitted.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A LED lighting unit, comprising:
 a support structure; an LED chip mounted within the support structure, the LED chip comprising a height of less than 0.6 mm;
 an optical beam shaping arrangement disposed over the support structure and comprising a microstructured layer positioned at a height of less than the square root of a light emitting area of the LED chip above the LED chip, the microstructured layer comprising:
 an optically transparent and thermally stable material having a refractive index; and at least one array of micro-elements that extend in a line giving a one-dimensional repetition, each micro-element having one or more sides which meet at a top apex, the one or more sides being straight from their base to the top apex, a distance from the top apex of at least one micro-element to a bottom surface of the LED lighting unit opposite the top apex is less than 1.5 mm; and
 a first material between the LED chip and the optical beam shaping arrangement, the first material having a first refractive index, the refractive index of the optically transparent and thermally stable material is between 0.3 and 0.65 greater than the first refractive index, and the optical beam shaping arrangement is: in contact with the first material of the first refractive index; or bonded to the first material of the first refractive index through an intermediate bonding layer; or bonded to the LED chip using a partial bonding layer having bonding portions and portions of the first material of the first refractive index.

2. A lighting unit as claimed in claim 1, wherein the beam shaping arrangement is in contact with the first material of the first refractive index.

3. A lighting unit as claimed in claim 1, wherein the optical beam shaping arrangement is bonded to the LED chip.

4. A lighting unit as claimed in claim 1, wherein the LED chip comprises:
 an LED die and a phosphor directly over the LED die; or
 an LED die, and the lighting unit further comprises a phosphor filling the support structure; or
 an LED die, and the lighting unit further comprises a phosphor layer beneath the first microstructured layer and spaced from the LED die.

5. A lighting unit as claimed in claim 1, comprising a plurality of beam shaping arrangements in a stack, and comprising a layer between the beam shaping arrangements which comprises air or an adhesive.

6. A lighting unit as claimed in claim 1, comprising a camera flash unit.

7. A lighting unit as claimed in claim 1, comprising a total of three or less LED chips mounted within the support structure, the LED chips having different colors.

8. A lighting unit as claimed in claim 1, comprising a total of two or less LED chips mounted within the support structure, the LED chips having different colors.

9. A lighting unit as claimed in claim 1, comprising a total of one LED chip mounted within the support structure.

10. A lighting unit as claimed in claim 1, wherein the optical beam shaping arrangement is bonded to the first material of the first refractive index through an intermediate bonding layer.

11. A lighting unit as claimed in claim 1, wherein the optical beam shaping arrangement is bonded to the LED chip using a partial bonding layer having bonding portions and portions of the first material of the first refractive index.

12. A lighting unit as claimed in claim 2, wherein the support structure comprises reflective side walls extending between the LED chip and the optical beam shaping arrangement.

13. A lighting unit as claimed in claim 2, wherein the microstructured layer comprises a silicone, a hybrid silicone, a silicate, a hybrid silicate, a sol-gel material, a polyimide, a glass or a transparent ceramic.

14. A lighting unit as claimed in claim 2, wherein the optical beam shaping arrangement comprises a base layer and the microstructured layer over the base layer, wherein the base layer preferably comprises a polyimide or a heat-stabilized PEN, or a silicones, or a glass or a transparent ceramic.

15. A lighting unit as claimed in claim 2, wherein the support structure supports the microstructured layer of the beam shaping arrangement at a height of less than 0.5 mm above the LED chip.

16. A lighting unit as claimed in claim 2, wherein the first material comprises: air with a refractive index of 1.0; a low refractive index layer with a refractive index below 1.3; or a covering layer with a refractive index between 1.3 and 1.6.

17. A lighting unit as claimed in claim 13, wherein the microstructured layer comprises a methylsiloxane, a methylphenyl siloxane, a phenylsiloxane, an epoxy functionalized siloxane or a high index silicone, a methylsilicate or methylphenylsilicate or phenyl silicate or other alkylsilicate, or materials derived from metal alkoxide precursors or mixtures thereof.

18. A lighting unit as claimed in claim 13, further comprising an adhesion promoting layer between the base layer and the microstructured layer.

19. A lighting unit as claimed in claim 18, wherein the adhesion promoting layer comprises a silane, titanate or zirconate containing material.

20. A mobile portable device comprising a camera optical sensor and a flash unit as claimed in claim 6.

* * * * *